United States Patent
Yalamarthy et al.

(10) Patent No.: US 11,765,863 B2
(45) Date of Patent: Sep. 19, 2023

(54) ACTIVE HEAT SINK

(71) Applicant: Frore Systems Inc., San Jose, CA (US)

(72) Inventors: Ananth Saran Yalamarthy, Stanford, CA (US); Prabhu Sathyamurthy, San Jose, CA (US); Suryaprakash Ganti, Los Altos, CA (US); Seshagiri Rao Madhavapeddy, La Jolla, CA (US); Vikram Mukundan, San Ramon, CA (US)

(73) Assignee: Frore Systems Inc., San Jose, CA (US)

(*) Notice: Subject to any disclaimer, the term of this patent is extended or adjusted under 35 U.S.C. 154(b) by 0 days.

(21) Appl. No.: 17/486,747

(22) Filed: Sep. 27, 2021

(65) Prior Publication Data
US 2022/0110220 A1 Apr. 7, 2022

Related U.S. Application Data

(60) Provisional application No. 63/087,002, filed on Oct. 2, 2020.

(51) Int. Cl.
*H05K 7/20* (2006.01)
*F28F 13/10* (2006.01)

(52) U.S. Cl.
CPC .......... *H05K 7/2039* (2013.01); *F28F 13/10* (2013.01)

(58) Field of Classification Search
CPC .... F04B 45/047; F04B 43/046; F04B 17/003; F04B 43/095; F04B 53/10; F04B 53/08; F04B 39/06; F04B 45/043; F04B 43/0054; F04B 39/121; F04B 39/1066; F04B 45/04; F04B 45/10; H01L 41/0973; H01L 41/09; H01L 23/46; H01L 23/4735; H01L 41/00; H01L 41/08; H01L 41/053; H05K 7/20272; H05K 7/20009; H05K 7/2039; H05K 7/20; H05K 7/20145; F16K 24/04; F16K 99/0048; F16K 31/004; F16K 7/17;
(Continued)

(56) References Cited

U.S. PATENT DOCUMENTS

| 4,251,031 A | 2/1981 | Martin |
| 4,450,505 A | 5/1984 | Mittal |
| 4,595,338 A | 6/1986 | Kolm |

(Continued)

FOREIGN PATENT DOCUMENTS

| CN | 101032718 | 9/2007 |
| CN | 101718235 | 6/2010 |

(Continued)

OTHER PUBLICATIONS

Liu et al., Application Prospects of Microfluidics Technology in Electronic Chip Cooling Research, Cryo & Supercond, vol. 37, No. 9, Sep. 16, 2009.

(Continued)

*Primary Examiner* — Michael A Matey
(74) *Attorney, Agent, or Firm* — Van Pelt, Yi & James LLP

(57) ABSTRACT

A system including a cooling element and a support structure is described. The cooling element has a first side and a second side opposite to the first side. The cooling element is configured to undergo vibrational motion when actuated to drive a fluid from the first side to the second side. The support structure thermally couples the cooling element to a heat-generating structure via thermal conduction.

19 Claims, 8 Drawing Sheets

(58) Field of Classification Search
CPC ........ F16K 99/0015; H04R 9/022; F04F 5/16; F28F 13/10
See application file for complete search history.

(56) References Cited

U.S. PATENT DOCUMENTS

| | | |
|---|---|---|
| 4,667,877 A | 5/1987 | Yao |
| 4,751,713 A | 6/1988 | Affleck |
| 4,780,062 A | 10/1988 | Yamada |
| 4,834,619 A | 5/1989 | Walton |
| 4,923,000 A | 5/1990 | Nelson |
| 5,008,582 A | 4/1991 | Tanuma |
| 5,673,171 A | 9/1997 | Varghese |
| 5,758,823 A | 6/1998 | Glezer |
| 5,796,152 A | 8/1998 | Carr |
| 5,821,962 A | 10/1998 | Kudo |
| 5,861,703 A | 1/1999 | Losinski |
| 6,211,598 B1 | 4/2001 | Dhuler |
| 6,232,680 B1 | 5/2001 | Bae |
| 6,450,773 B1 | 9/2002 | Upton |
| 6,483,419 B1 | 11/2002 | Weaver |
| 6,498,725 B2 | 12/2002 | Cole |
| 6,531,947 B1 | 3/2003 | Weaver |
| 6,570,750 B1 | 5/2003 | Calcatera |
| 6,588,497 B1 | 7/2003 | Glezer |
| 6,598,960 B1 | 7/2003 | Cabal |
| 6,612,816 B1 | 9/2003 | Vanden Brande |
| 6,650,542 B1 | 11/2003 | Chrysler |
| 6,713,942 B2 | 3/2004 | Raman |
| 6,771,158 B2 | 8/2004 | Lee |
| 6,853,068 B1 | 2/2005 | Djekic |
| 6,876,047 B2 | 4/2005 | Cunningham |
| 6,996,441 B1 | 2/2006 | Tobias |
| 7,023,697 B2 | 4/2006 | Pokharna |
| 7,031,155 B2 | 4/2006 | Sauciuc |
| 7,081,699 B2 | 7/2006 | Keolian |
| 7,258,464 B2 | 8/2007 | Morris |
| 7,282,837 B2 | 10/2007 | Scher |
| 7,321,184 B2 | 1/2008 | Lee |
| 7,324,323 B2 | 1/2008 | Aksyuk |
| 7,420,807 B2 | 9/2008 | Mikubo |
| 7,492,076 B2 | 2/2009 | Heim |
| 7,516,776 B2 | 4/2009 | Bezama |
| 7,553,135 B2 | 6/2009 | Cho |
| 7,714,433 B2 | 5/2010 | Campini |
| 7,742,299 B2 | 6/2010 | Sauciuc |
| 7,972,124 B2 | 7/2011 | Hirata |
| 3,051,905 A1 | 11/2011 | Mehmet |
| 8,289,701 B2 | 10/2012 | Suzuki |
| 8,297,947 B2 | 10/2012 | Van Rensburg |
| 8,308,453 B2 | 11/2012 | Yamamoto |
| 8,308,454 B2 | 11/2012 | Kamitani |
| 8,520,383 B2 | 8/2013 | Park |
| 8,520,384 B2 | 8/2013 | Park |
| 8,659,896 B2 | 2/2014 | Dede |
| 8,678,787 B2 | 3/2014 | Hirata |
| 8,684,707 B2 | 4/2014 | Kanai |
| 8,736,139 B2 | 5/2014 | Lee |
| 8,899,944 B2 | 12/2014 | Kanai |
| 8,934,240 B2 | 1/2015 | Yu |
| 9,179,575 B1 | 11/2015 | Yao |
| 9,215,520 B2 | 12/2015 | De Bock |
| 9,252,069 B2 | 2/2016 | Bhunia |
| 9,466,452 B1 | 10/2016 | Liu |
| 9,523,367 B2 | 12/2016 | Lucas |
| 9,846,461 B2 | 12/2017 | Tang |
| 9,976,547 B2 | 5/2018 | Tanaka |
| 10,045,461 B1* | 8/2018 | Boozer ............... H04R 3/007 |
| 10,288,192 B2* | 5/2019 | Han ..................... F04B 45/047 |
| 10,364,910 B2* | 7/2019 | Han ..................... F04B 43/046 |
| 10,480,502 B2 | 11/2019 | Hirata |
| 10,788,034 B2 | 9/2020 | Ganti |
| 10,943,850 B2 | 3/2021 | Ganti |
| 11,043,444 B2 | 6/2021 | Ganti |
| 11,242,241 B2 | 2/2022 | Menon |
| 11,466,674 B2* | 10/2022 | Chang ................. F04B 39/102 |
| 2002/0163782 A1 | 11/2002 | Cole |
| 2002/0184907 A1 | 12/2002 | Vaiyapuri |
| 2004/0023614 A1 | 2/2004 | Koplin |
| 2004/0190251 A1 | 9/2004 | Prasher |
| 2004/0196999 A1* | 10/2004 | Han ..................... H04R 1/2819 381/345 |
| 2004/0218362 A1 | 11/2004 | Amaro |
| 2004/0244405 A1 | 12/2004 | Kim |
| 2004/0253130 A1 | 12/2004 | Sauciuc |
| 2005/0074662 A1 | 4/2005 | Cho |
| 2005/0089415 A1 | 4/2005 | Cho |
| 2005/0110841 A1 | 5/2005 | Silverbrook |
| 2005/0178529 A1 | 8/2005 | Suzuki |
| 2005/0211418 A1 | 9/2005 | Kenny |
| 2005/0225213 A1 | 10/2005 | Richards |
| 2005/0266286 A1 | 12/2005 | Sato |
| 2005/0280994 A1 | 12/2005 | Yazawa |
| 2006/0147324 A1 | 7/2006 | Tanner |
| 2006/0164805 A1 | 7/2006 | Meinders |
| 2006/0181848 A1 | 8/2006 | Kiley |
| 2006/0208613 A1 | 9/2006 | Scher |
| 2006/0232167 A1 | 10/2006 | Jordan |
| 2006/0236710 A1 | 10/2006 | Vaiyapuri |
| 2006/0250773 A1 | 11/2006 | Campbell |
| 2006/0250774 A1 | 11/2006 | Campbell |
| 2006/0260784 A1 | 11/2006 | Bezama |
| 2006/0268534 A1 | 11/2006 | Paydar |
| 2007/0020124 A1 | 1/2007 | Singhal |
| 2007/0037506 A1 | 2/2007 | Lee |
| 2007/0048154 A1 | 3/2007 | Sapir |
| 2007/0076375 A1 | 4/2007 | Mongia |
| 2007/0235180 A1 | 10/2007 | Ouyang |
| 2007/0274045 A1 | 11/2007 | Campbell |
| 2008/0041574 A1 | 2/2008 | Arik |
| 2008/0101965 A1 | 5/2008 | Zhang |
| 2008/0111866 A1 | 5/2008 | Silverbrook |
| 2008/0218972 A1 | 9/2008 | Sauciuc |
| 2008/0304979 A1 | 12/2008 | Lucas |
| 2009/0021908 A1 | 1/2009 | Patel |
| 2009/0034197 A1 | 2/2009 | Leija |
| 2009/0050294 A1 | 2/2009 | Fedorov |
| 2009/0120621 A1 | 5/2009 | Sheinman |
| 2009/0148320 A1* | 6/2009 | Lucas ................... F04B 43/046 417/481 |
| 2009/0167109 A1 | 7/2009 | Tomita |
| 2009/0174999 A1 | 7/2009 | Sauciuc |
| 2009/0232683 A1* | 9/2009 | Hirata ................... F04B 45/047 417/413.2 |
| 2009/0232684 A1* | 9/2009 | Hirata ................... F04B 43/046 417/413.2 |
| 2009/0232685 A1 | 9/2009 | Kamitani |
| 2010/0067191 A1 | 3/2010 | Arik |
| 2010/0073431 A1 | 3/2010 | Silverbrook |
| 2010/0074775 A1 | 3/2010 | Yamamoto |
| 2011/0063800 A1 | 3/2011 | Park |
| 2011/0068799 A1 | 3/2011 | Wolf |
| 2011/0096125 A1 | 4/2011 | Silverbrook |
| 2011/0122582 A1 | 5/2011 | Park |
| 2011/0211020 A1 | 9/2011 | Silverbrook |
| 2011/0259557 A1 | 10/2011 | Chao |
| 2011/0277491 A1 | 11/2011 | Wu |
| 2011/0304240 A1 | 12/2011 | Meitav |
| 2012/0063091 A1 | 3/2012 | Dede |
| 2012/0171062 A1 | 7/2012 | Kodama |
| 2012/0301333 A1 | 11/2012 | Smirnov |
| 2013/0058818 A1* | 3/2013 | Hirata ................... F04B 45/047 417/479 |
| 2013/0071269 A1* | 3/2013 | Fujisaki ............... F04B 43/046 417/413.2 |
| 2013/0157729 A1 | 6/2013 | Tabe |
| 2013/0225065 A1 | 8/2013 | Lee |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |

(56) References Cited

U.S. PATENT DOCUMENTS

| | | |
|---|---|---|
| 2015/0173237 A1 | 6/2015 | Lin |
| 2015/0308377 A1 | 10/2015 | Packard |
| 2016/0025429 A1* | 1/2016 | Muir .............. F04D 33/00 |
| | | 318/116 |
| 2016/0076530 A1* | 3/2016 | Chen .............. F04B 45/047 |
| | | 417/413.2 |
| 2016/0353186 A1* | 12/2016 | Rothkopf ............ G04G 21/02 |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0222123 A1* | 8/2017 | Chen ............... F16K 99/0048 |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2018/0240734 A1* | 8/2018 | Liao ................ H01L 23/36 |
| 2019/0062150 A1 | 2/2019 | Moitzi |
| 2019/0067550 A1 | 2/2019 | Mou |
| 2019/0085836 A1* | 3/2019 | Mou ............... F04B 45/047 |
| 2019/0101938 A1 | 4/2019 | Mou |
| 2019/0309744 A1 | 10/2019 | Ting |
| 2020/0049386 A1 | 2/2020 | Ganti |
| 2020/0051895 A1 | 2/2020 | Ganti |
| 2020/0053905 A1* | 2/2020 | Ganti ............. H04M 1/0202 |
| 2020/0088185 A1* | 3/2020 | Mou ................ H01L 41/083 |
| 2020/0229320 A1 | 7/2020 | Mou |
| 2021/0131415 A1* | 5/2021 | Yalamarthy ........... G05D 19/02 |
| 2021/0144884 A1 | 5/2021 | Mou |
| 2021/0176894 A1* | 6/2021 | Yalamarthy ............ F04D 33/00 |
| 2021/0176895 A1 | 6/2021 | Mukundan |
| 2021/0180723 A1 | 6/2021 | Vikram |
| 2021/0183739 A1 | 6/2021 | Sathyamurthy |
| 2021/0185853 A1* | 6/2021 | Ganti .................. G06F 1/206 |
| 2021/0185856 A1* | 6/2021 | Ganti ................ H05K 7/20145 |
| 2022/0081284 A1* | 3/2022 | Ganti .................. B81B 7/0061 |
| 2022/0087058 A1* | 3/2022 | Sankar ............. H05K 7/20172 |
| 2022/0087064 A1* | 3/2022 | Ganti ............... F04B 45/047 |
| 2022/0150335 A1* | 5/2022 | Sathyamurthy ........ G06F 1/203 |
| 2022/0187033 A1* | 6/2022 | Sankar ................. F28F 13/12 |
| 2022/0189852 A1* | 6/2022 | Sathyamurthy ........... F04B 1/00 |
| 2022/0282932 A1* | 9/2022 | Sathyamurthy ......... F04D 33/00 |

FOREIGN PATENT DOCUMENTS

| | | |
|---|---|---|
| CN | 101785103 | 7/2010 |
| CN | 103828050 | 5/2014 |
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| CN | 207287973 | 5/2018 |
| CN | 109641738 | 4/2019 |
| CN | 113898563 | 4/2022 |
| EP | 3290211 | 3/2018 |
| JP | S59152793 | 8/1984 |
| JP | H09246766 | 9/1997 |
| JP | 2000323882 | 11/2000 |
| JP | 2001119181 | 4/2001 |
| JP | 2002130198 | 5/2002 |
| JP | 2008159688 | 7/2008 |
| JP | 2008525709 | 7/2008 |
| JP | 2008263830 | 11/2008 |
| JP | 2010029759 | 2/2010 |
| JP | 2011144743 | 7/2011 |
| JP | 2013223818 | 10/2013 |
| JP | 2018022868 | 2/2018 |
| JP | 2018085510 | 5/2018 |
| JP | 2018085511 | 5/2018 |
| KR | 20050026992 | 3/2005 |
| KR | 20070063029 | 6/2007 |
| TW | 200635493 | 10/2006 |
| TW | 201638469 | 11/2016 |
| TW | 542326 | 5/2017 |
| TW | M542326 | 5/2017 |
| TW | 201814772 | 4/2018 |
| WO | 2014024608 | 2/2014 |

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

H.Q. Li, "A High Frequency High Flow Rate Piezoelectrically Driven Mems Micropump", Solid-State Sensors, Actuators, and Microsystems Workshop, Jun. 4-8, 2000, pp. 69-72.

* cited by examiner

ACTIVE HEAT SINK

CROSS REFERENCE TO OTHER APPLICATIONS

This application claims priority to U.S. Provisional Patent Application No. 63/087,002 entitled ACTIVE HEAT SINK filed Oct. 2, 2020 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
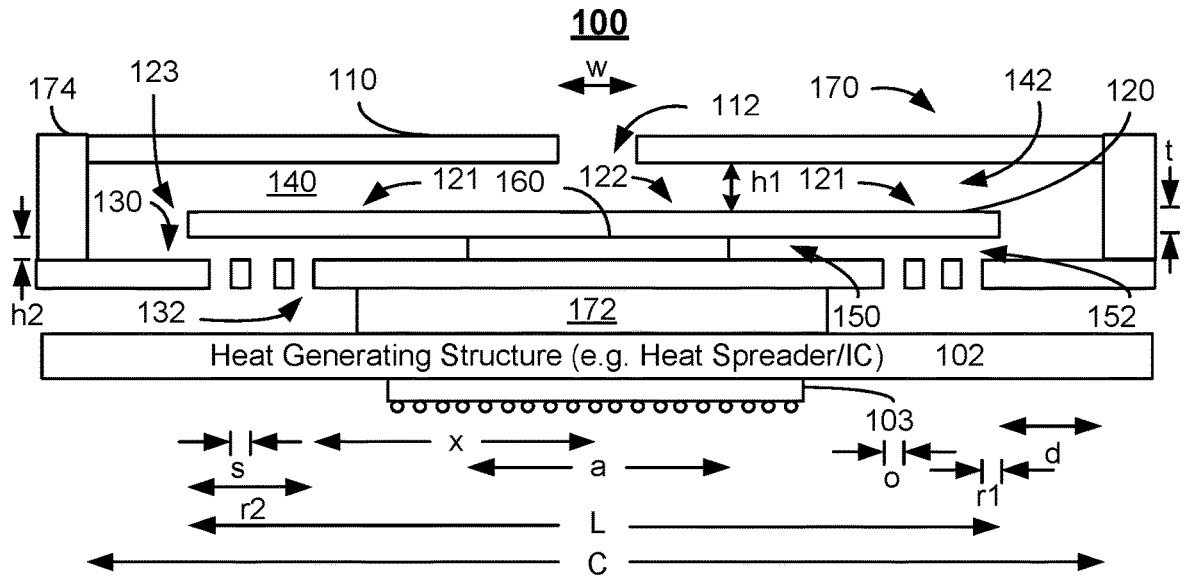
FIGS. 1A-1F depict embodiments of active cooling systems including active heat sinks.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

Similarly, servers, batteries, automotive components, some mobile devices and other technologies that typically used for longer periods of time are desired to be cooled. For such technologies, heat generated during steady state operation of the device may be a larger concern. Thus steady state cooling solutions are also desired.

A system including a cooling element and a support structure is described. The cooling element has a first side and a second side opposite to the first side. The cooling element is configured to undergo vibrational motion when actuated to drive a fluid from the first side to the second side. The support structure thermally couples the cooling element to a heat-generating structure via thermal conduction. In some embodiments, the support structure further includes a bottom plate and sidewalls forming a chamber therein. The cooling element is in the chamber. The bottom plate and/or the sidewalls have orifices therein. The cooling element is actuated to drive the fluid through the orifices. The vibrational motion of the cooling element may drive the fluid such that the fluid exiting the orifices has a speed of at least thirty meters per second. The support structure may also include a top plate having vent(s) therein. The cooling element is in between the top plate and the heat-generating structure. Thus, a top chamber is formed between the cooling element and the top plate and a bottom chamber is formed between the cooling element and the bottom plate. The cooling element may have a central region and a perimeter. The support structure may further include an anchor configured to support the cooling element at the central region. At least a portion of the perimeter is free to undergo the vibrational motion.

In some embodiments, the system includes a heat spreader integrated with the support structure. The heat spreader is thermally coupled to the support structure and the heat-generating structure via thermal conduction. In some embodiments, the support structure is configured such that the fluid exiting at least a portion of the orifices impinges on the heat spreader to extract heat from the heat spreader. The heat spreader extracting heat from the heat-generating structure via thermal conduction. The cooling element may be configured such that the fluid driven by the vibrational motion extracts heat from the cooling element. In some embodiments, the support structure includes a pedestal thermally conductively coupled to the heat-generating structure. The heat-generating structure may be is selected from an integrated circuit, a battery, a heat spreader, and a vapor chamber.

An active heat sink is described. The active heat sink includes multiple cooling cells and a support structure. Each of the cooling cells includes a cooling element, a top plate having at least one vent therein, a bottom plate, sidewalls forming a chamber therein, and an anchor. The cooling element is in the chamber between the top plate and the bottom plate. The bottom plate and/or the sidewalls have orifices therein. The cooling element is actuated to undergo vibrational motion to drive a fluid through the orifices. The support structure is integrated with the cooling cells and thermally couples the cooling element to a heat-generating structure via thermal conduction.

In some embodiments, the cooling element has a central region and a perimeter. In such embodiments, the support structure further includes an anchor for each of the cooling elements. The anchor is configured to support the cooling element at the central region. At least a portion of the perimeter is free to undergo the vibrational motion. In some embodiments, the active heat sink includes a heat spreader integrated with the support structure. The heat spreader is thermally coupled to the support structure and the heat-generating structure via thermal conduction. The cooling element may be configured such that the fluid driven by the vibrational motion extracts heat from the cooling element. In some embodiments, the support structure further includes a pedestal thermally conductively connecting the heat-generating structure. In some embodiments, the heat-generating structure is selected from an integrated circuit, a battery, a heat spreader, and a vapor chamber.

A method of cooling a heat-generating structure is described. The method includes driving a cooling element to induce a vibrational motion at a frequency. The cooling element has a first side and a second side opposite to the first side. The cooling element is configured to undergo vibrational motion when actuated to drive a fluid from the first side to the second side. The cooling element is thermally coupled by a support structure to the heat-generating structure. The support structure thermally couples the cooling element to the heat-generating structure via thermal conduction. In some embodiments, the frequency corresponds to a structural resonance for the cooling element and to an acoustic resonance for at least a portion of a chamber in which the cooling element resides. In some embodiments, the cooling element is one of a plurality of cooling elements. In such embodiments, driving the cooling element further includes driving the plurality of cooling elements to induce the vibrational motion in each of the cooling elements. Each of the cooling elements is thermally coupled to the heat-generating structure via thermal conduction. In some embodiments, a heat spreader is integrated with the support structure. The heat spreader is thermally coupled to the heat-generating structure.

Figure 1B:
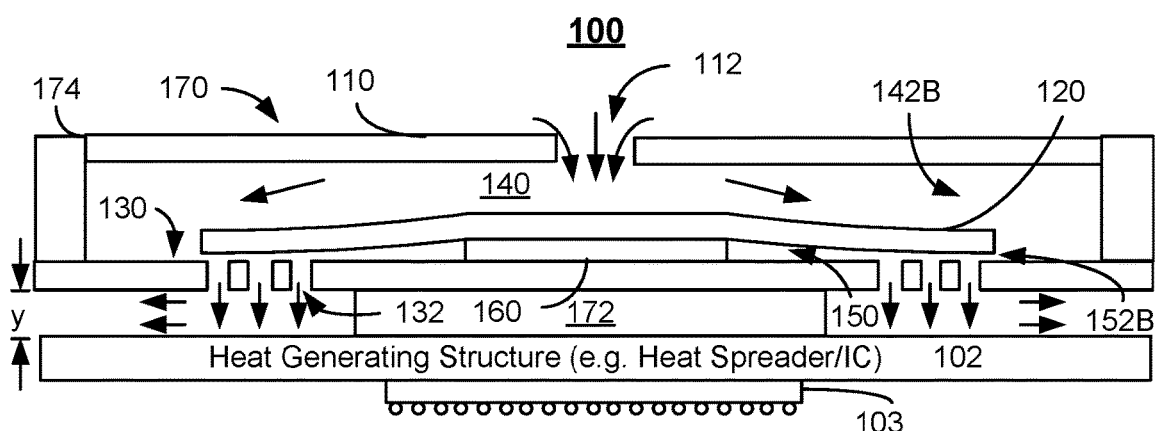
Figure 1C:
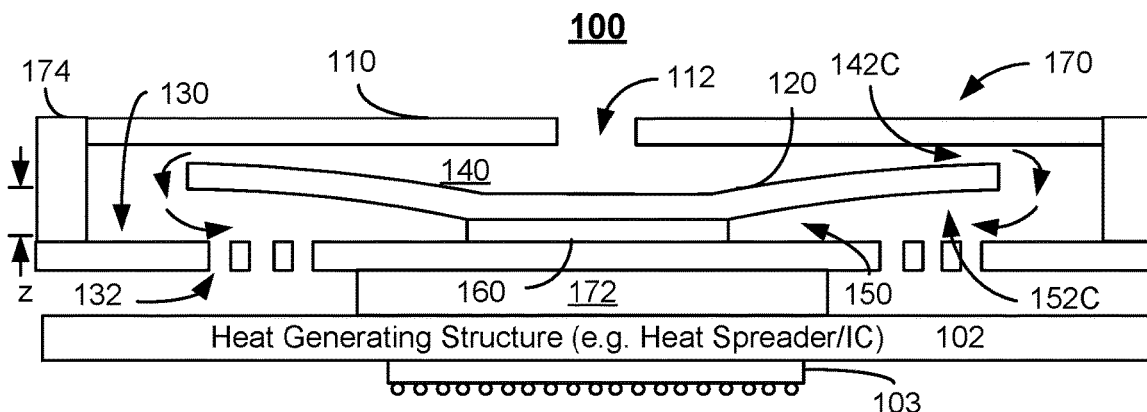
Figure 1D:
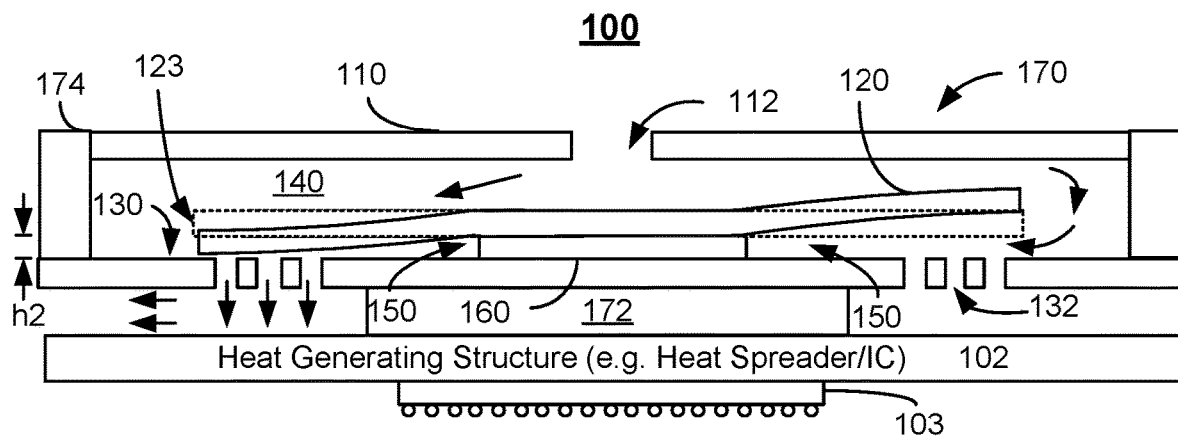
Figure 1E:
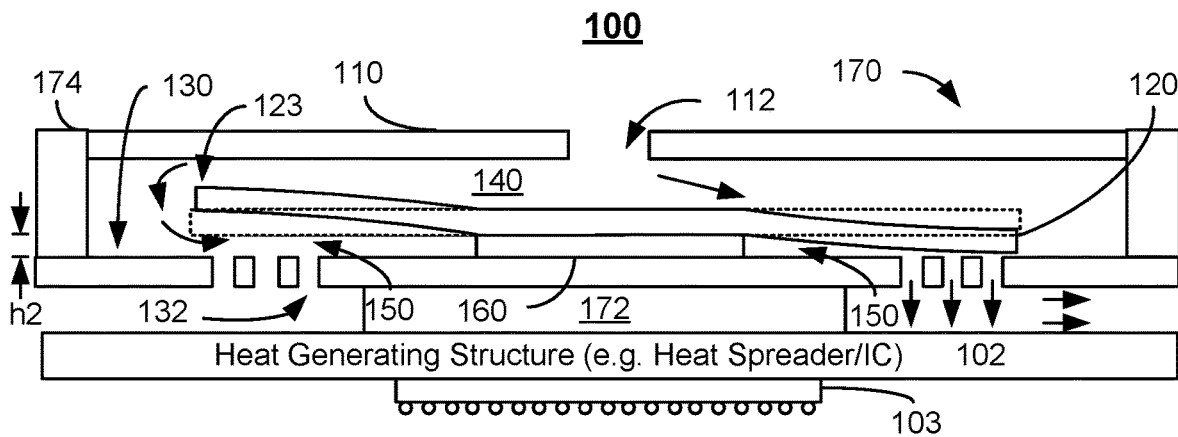
Figure 1F:
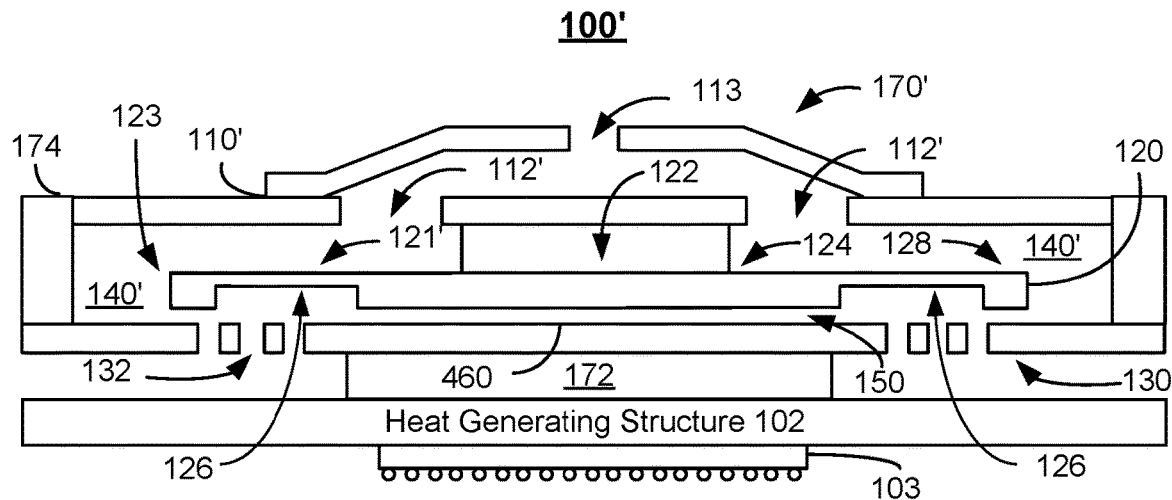

FIGS. 1A-1F are diagrams depicting exemplary embodiments of active cooling systems 100 and 100' usable with heat-generating structure 102 and forming an active heat sink. For clarity, only certain components are shown. FIGS. 1A-1F are not to scale. Although shown as symmetric, cooling system(s) 100 and/or 100' need not be. FIGS. 1A-1E depict various modes of one embodiment of a cooling system. FIG. 1F depicts another embodiment of a cooling system 100'.

Cooling system 100 includes cooling element 120 and support structure 170. In the embodiment shown in FIGS. 1A-1E, support structure 170 includes top plate 110 having vent 112 therein, orifice plate 130 having orifices 132 therein, anchor 160, pedestal 172 and sidewalls 174. Cooling element 120 divides the interior of support structure 170 into top chamber 140 and bottom chamber 150. Chambers 140 and 150 (collectively chamber 140/150) are formed within orifice, or bottom, plate 130, top plate 110 and sidewalls 174. Support structure 170 is thermally coupled to heat-generating structure 102 via pedestal 172. Pedestal 172 also provides a space for fluid to flow between orifice plate 130 and heat-generating structure 102 (i.e. a jet channel). In some embodiments, heat-generating structure 102 is separate from cooling system 100. In some embodiments, heat-generating structure 102 may be integrated into support structure 170. In such embodiments, heat-generating structure 102 may be a heat spreader that is thermally and mechanically coupled to cooling element 120 via pedestal 172, orifice plate 130, and anchor 160. Thus, heat-generating structure (i.e. heat spreader) 102 extracts heat from integrated circuit 103 (or other structure that generates heat) via conduction. This heat may be transferred to other portions of cooling system 100 through pedestal 172 via conduction.

Cooling element 120 is supported at its central region by anchor 160. Regions of cooling element 120 closer to and including portions of the cooling element's perimeter (e.g. tip 123) vibrate when actuated. In some embodiments, tip 123 of cooling element 120 includes a portion of the perimeter furthest from anchor 160 and undergoes the largest deflection during actuation of cooling element 120. For clarity, only one tip 123 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

In the embodiment shown, heat-generating structure 102 is a heat spreader or vapor chamber thermally connected to integrated circuit 103. Thus, integrated circuit 103 generates heat, which is transferred to heat-generating structure (i.e. heat spreader) 102. Thus, integrated circuit 103 may also be considered to be a heat-generating structure. In the embodiment shown, the heat is transferred between integrated circuit 103 and heat spreader 102 via conduction. In some embodiments, an additional structure may be interposed between heat-generating structure 102 and integrated circuit 103. For example, an additional heat spreader and/or a vapor chamber may be present. Because cooling system 100 is thermally coupled to and cools structure 102, structure 102 is described as a heat-generating structure. However, in the embodiment shown, cooling of heat-generating structure 102 is a mechanism for managing heat produced by integrated circuit 103. In some embodiments, heat-generating structure 102 generates heat. For example, heat-generating structure 102 may be an integrated circuit, such as integrated circuit 103. Such an embodiment may be viewed as omitting heat-generating structure 102 or omitting integrated circuit 103. In some embodiments, heat-generating structure 102 is desired to be cooled but does not generate heat itself. Heat-generating structure 102 may conduct heat (e.g. from a nearby object that generates heat such as integrated circuit 103). Thus, heat-generating structure 102 might be a heat spreader or a vapor chamber as shown in FIGS. 1A-1F. In some such embodiments, heat-generating structure 102 may be a thermally conductive part of a module containing cooling system 100. For example, cooling system 100 may be affixed to heat-generating structure 102, which may be coupled to another heat sink, vapor chamber, integrated circuit 103, or other separate structure desired to be cooled. Although described in the context of integrated circuit 103, cooling system 100 may be used to cool another component or device. For example, heat-generating structure 102 or integrated circuit 103 may include or be replaced by other semiconductor components(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 123), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Cooling element 120 includes an anchored region 122 and cantilevered arms 121. For simplicity, anchored region 122 and cantilevered arms 121 are only labeled in FIGS. 1A and 1F. Anchored region 122 is supported (e.g. held in place) in cooling system 100 by anchor 160. Cantilevered arms 121 undergo vibrational motion in response to cooling element 120 being actuated. In the embodiment shown in FIGS. 1A-1F, anchored region 122 is centrally located along an axis of cooling elements 120 and 120'. In other embodiments, anchored region 122 may be at one edge of the actuator and outer region 128 at the opposing edge. In such embodiments, cooling element 120 is edge anchored. Although depicted as having a uniform thickness, in some embodiments, cooling element 120 may have a varying thickness. For example, cooling element 120 may be replaced by cooling element 120', discussed below.

Anchor 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. cantilevered arms 121 including tip 123) move in a cantilevered fashion. Thus, cantilevered arms 121 of cooling element 120 may move in a manner analogous to the wings of a butterfly (i.e. in-phase) and/or analogous to a seesaw (i.e. out-of-phase). Thus, the cantilevered arms 121 of cooling element 120 that vibrate in a cantilevered fashion do so in-phase in some embodiments and out-of-phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). Such an embodiment is shown and described in the context of FIG. 1F. In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side and a second side. In some embodiments, the first side is distal from heat-generating structure 102 and the second side is proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 (e.g. distal from heat-generating structure 102/from top chamber 140) to a second side of cooling element 120 (e.g. proximate to heat-generating structure 102/to bottom chamber 150). The vibrational motion of cooling element 120 draws fluid through vent 112 and into top chamber 140; forces fluid from top chamber 140 to bottom chamber 150; and drives fluid from bottom chamber 150 through orifices 132 of orifice plate 130. Further, cooling element 120 and orifices 132 may be configured to reduce back flow of fluid from the jet channel into bottom chamber 150. Thus, cooling element 120 may be viewed as an actuator. Although described in the context of a single, continuous cooling element, in some embodiments, cooling element 120 may be formed by two (or more) cooling elements. Each of the cooling elements has one portion pinned (e.g. supported by anchor 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be cantilevered arm(s) 121 in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 123 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number, other location(s) and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 123 that suction in the upstroke of cooling element 120 (tip 123 moves away from orifice plate 13) that would pull fluid into bottom chamber 150 through orifices 132 is reduced. The locations of orifices are also desired to be sufficiently close to tip 123 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 123 and not more than a distance, r2, from tip 123 of cooling element 120. In some embodiments r1 is at least one hundred micrometers (e.g. r1≥100 μm) and r2 is not more than one millimeter (e.g. r2≥1000 μm). In some embodiments, orifices 132 are at least two hundred micrometers from tip 123 of cooling element 120 (e.g. r1≥200 μm). In some such embodiments, orifices 132 are at least three hundred micrometers from tip 123 of cooling element 120 (e.g. r1≥300 μm). In some embodiments, orifices 132 have a width of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or a Ti (e.g. a Ti alloy such as Ti6Al-4V). In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that cantilevered arms 121 and tip 123 move away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 (toward heat-generating structure 102) at a high speed, for example in excess of thirty-five meters per second. Thus, fluid exits orifices 132 at the high speeds described herein. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B.

Cooling element 120 is also actuated so that cantilevered arms 121 and thus tip 123 move away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 123 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. In some embodiments, this corresponds to the structural resonance of cantilevered arms 121. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid impinges on heat-generating structure 102 and may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1D-1E depict an embodiment of active cooling system 100 including centrally anchored cooling element 120 in which the cooling element is driven out-of-phase. More specifically, cantilevered arms 121 of cooling element 120 on opposite sides of anchor 160 (and thus on opposite sides of the central, anchored region 122 of cooling element 120 that is supported by anchor 160) are driven to vibrate out-of-phase. In some embodiments, cantilevered arms 121 of cooling element 120 on opposite sides of anchor 160 are driven at or near one hundred and eighty degrees out-of-phase. Thus, one cantilevered arm 121 of cooling element 120 vibrates toward top plate 110, while the other cantilevered arm 121 of cooling element 120 vibrates toward orifice plate 130/heat-generating structure 102. Movement of a cantilevered arms 121 of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These, issues are avoided through the use of pressure differentials and fluid flow as discussed above. The benefits of improved, quiet cooling may be achieved with limited additional power. Further, out-of-phase vibration of cooling element 120 allows the position of the center of mass of cooling element 100 to remain more stable. Although a torque is exerted on cooling element 120, the force due to the motion of the center of mass is reduced or eliminated. As a result, vibrations due to the motion of cooling element 120 may be reduced. Moreover, efficiency of cooling system 100 may be improved through the use of out-of-phase vibrational motion for the two sides of cooling element 120. For out-of-phase vibration of cantilevered arms 121, vibrations through cooling system 100 may also be reduced. Consequently, performance of devices incorporating the cooling system 100 may be improved. Further, cooling system 100 may be usable in other applications (e.g. with or without heat-generating structure 102) in which high fluid flows and/or velocities are desired.

FIG. 1F depicts and embodiment of active cooling system 100' including a top centrally anchored cooling element. Cooling system 100' is analogous to cooling system 100. Consequently, analogous components have similar labels. For example, cooling system 100' is used in conjunction with heat-generating structure 102 and integrated circuit 103, which are analogous to heat-generating structure 102 and integrated circuit 103.

Cooling system 100' includes support structure 170', top plate 110' having vents 112', cooling element 120', orifice plate 130 including orifices 132, top chamber 140' having a gap, bottom chamber 150 having a gap and anchor 160 that are analogous to support structure 170, top plate 110 having vent 112, cooling element 120', orifice plate 130 including orifices 132, top chamber 140 having gap 142, bottom chamber 150 having gap 152 and anchor 160, respectively, of FIGS. 1A-1E. Thus, cooling element 120' is centrally supported by anchor 160 such that at least a portion of the perimeter of cooling element 120' is free to vibrate. In some embodiments, anchor 160 extends along the axis of cooling element 120' (e.g. in a manner analogous to anchor 360A and/or 360B). In other embodiments, anchor 160 is only near the center portion of cooling element 120' (e.g. analogous to anchor 360C and/or 360D).

Anchor 160 supports cooling element 120' from above. Thus, cooling element 120' is suspended from anchor 160. Anchor 160 is suspended from top plate 110'. Top plate 110' includes vent 113. Vents 112' on the sides of anchor 160 provide a path for fluid to flow into sides of chamber 140'.

Engineered cooling element 120' has a tailored geometry and is usable in a cooling system such as cooling system 100 and/or 100'. Cooling element 120' includes an anchored region 122 and cantilevered arms 121'. Anchored region 122 is supported (e.g. held in place) in cooling system 100 by anchor 160. Cantilevered arms 121' undergo vibrational motion in response to cooling element 120' being actuated. Thus, cooling element 120' operates in an analogous manner to cooling element 120 and can be used in cooling system 100. Each cantilevered arm 121' includes step region 124, extension region 126 and outer region 128. In the embodiment shown in FIG. 1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. Outer region 128 and step region 124 may each have a thickness of at least three hundred twenty micrometers and not more than three hundred and sixty micrometers. In some embodiments, the outer thickness is at least fifty micrometers and not more than two hundred micrometers greater than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width (from tip 123 to extension region 126) of at least one hundred micrometers and not more than three hundred micrometers. Extension 126 region has a length from the step region 124 to outer region 128 of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120', and/or another mechanism.

As discussed above with respect to cooling system 100, cooling element 120' may be driven to vibrate at or near the structural resonant frequency of cooling element 120'. Further, the structural resonant frequency of cooling element 120' may be configured to align with the acoustic resonance of the chamber 140'/150. The structural and acoustic resonant frequencies are generally chosen to be in the ultrasonic range. For example, the vibrational motion of cooling element 120' may be at the frequencies described with respect to cooling system 100. Consequently, efficiency and flow rate may be enhanced. However, other frequencies may be used.

Cooling system 100' operates in an analogous manner to cooling system 100. Cooling system 100' thus shares the benefits of cooling system 100. Thus, performance of a device employing cooling system 100' may be improved. The use of cooling element 120' configured in a manner analogous to cooling element 120' may improve efficiency and reliability. In addition, vibrations in cooling system 100' that may affect other cooling cells (not shown), may be reduced. For example, less vibration may be induced in top plate 110' due to the motion of cooling element 120'. Consequently, cross talk between cooling system 100' and other cooling systems (e.g. other cells) or other portions of the device incorporating cooling system 100' may be reduced. Thus, performance may be enhanced.

Use of engineered cooling element 120' may further improve efficiency of cooling system 100 and/or 100'. Extension region 126 is thinner than step region 124 and outer region 128. This results in a cavity in the bottom of cooling element 120' corresponding to extension region 126. The presence of this cavity aids in improving the efficiency of cooling system 100'. Each cantilevered arm 121' vibrates towards top plate 110 in an upstroke and away from top plate 110 in a downstroke. When cantilevered arm 121' moves toward top plate 110, higher pressure fluid in top chamber 140 resists the motion of cantilevered arm 121'. Furthermore, suction in bottom chamber 150 also resists the upward motion of cantilevered arm 121' during the upstroke. In the downstroke of cantilevered arm 121', increased pressure in the bottom chamber 150 and suction in top chamber 140 resist the downward motion of cantilevered arm 121'. However, the presence of the cavity in cantilevered arm 121' corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 121' may more readily move through the fluid. This may be achieved while substantially maintaining a higher pressure in top chamber 140, which drives the fluid flow through cooling system 100 and/or 100'. Moreover, the presence of outer region 128 may improve the ability of cantilevered arm 121' to move through the fluid being driven through cooling system 100. Outer region 128 has a higher mass per unit length and thus a higher momentum. Consequently, outer region 128 may improve the ability of cantilevered arms 121' to move through the fluid being driven through cooling system 100. The magnitude of the deflection of cantilevered arm 121' may also be increased. These benefits may be achieved while maintaining the stiffness of cantilevered arms 121' through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100' employing cooling element 120' may be improved.

As discussed above, cooling systems 100 and 100' may cool heat-generating structure 102 (and thus integrated circuit 103) using jets of fluid exiting orifices 132 and impinging on heat-generating structure (i.e. heat spreader) 102 or integrated circuit 103 (or another component that is a source of heat). However, cooling systems 100 and/or 100' may have an additional mechanism for cooling heat-generating structure. Cooling systems 100 and/or 100' are thermally coupled to heat-generating structure 102 via support structure 170 such that heat may be transferred from heat-generating structure 102 to cooling system 100 via conduction. For example, pedestal 172 may be made from thermally conductive materials. Pedestal 172 may also be joined to heat-generating structure 102 using a highly thermally conductive mechanism, such as a thermally conductive epoxy. Similarly, pedestal 172 may have a thermal mass that is relatively large (e.g. a significant fraction of or greater than) compared to the thermal mass of heat-generating structure 102. For example, pedestal 172 may include or consist of high thermal capacity material(s) (e.g. steels and aluminum alloys) and/or high thermal conductivity materials (e.g. copper and aluminum). Pedestal 172 may also contact heat-generating structure 102 over a wide area. Pedestal 172 may range in size from approximately the size of anchor 160 to across the cooling cell 100 and/or 100' or across an entire tile formed of multiple cooling cells. For example, pedestal 172 may extend out of the plane of the page across the entire cooling system 100 or across multiple cooling systems. Further, cooling element 120/120' is thermally coupled to support structure 170 and/or 170' via anchor 160 and/or top plate 110', respectively. Thus, heat may be conducted from heat-generating structure 102 to cooling element 120/120' and the remainder of support structure 170 and/or 170', respectively. Thus, cooling system(s) 100 and/or 100' may act as heat sinks for heat-generating structure 102 and integrated circuit 103. Further, because of its shape (e.g. large surface area), cooling element 120' may function as a fin.

In addition, cooling system(s) 100 and/or 100' are active cooling systems. Consequently, cooling system(s) 100 and/or 100' may be considered active heat sinks in some embodiments. More specifically, cooling element 120/120' undergoes vibrational motion. In addition to driving fluid through orifices 132, the vibrational motion drives fluid into chambers 140/150 and 140'/150, through chambers 140/150 and 140'/150, and past cooling elements 120'. Because fluid is driven past cooling element 120/120' and through support structure(s) 170 and/or 170', heat in cooling element 120' and support structure(s) 170 and/or 170' is transferred to the fluid. Consequently, in addition to or instead of transferring fluid directly from heat-generating structure 102, fluid can remove heat from cooling element 120/120' and/or support structure 110/170'.

Moreover, cooling systems 100 and 100' drive fluid such that fluid exiting orifices 132 has a high speed of at least thirty meters per second. In some embodiments, the fluid exiting orifices 132 has a speed of at least forty-five meters per second. In some embodiments, the fluid exits orifices 132 at speeds of at least sixty meters per second. Other speeds may be possible in some embodiments. Fluid exiting orifices 132 has a high speed in part because the fluid traveling through chambers 140/150 has a high flow rate. In some embodiments, for example, the flow rate through chambers 140/150 may be at least 0.05 cubic feet per minute (cfm). In some embodiments, the flow rate through chambers 140/150 is at least 0.1 cfm. Other (i.e. higher or lower) flow rates are possible. The relatively high flow rates that may be driven through cooling system(s) 100 and/or 100' efficiently remove heat from cooling elements 120/120' and support structure(s) 170 and/or 170'. Thus, in addition to conduction by support structure 170/170' and cooling element 120/120', transfer of heat to the fluid via convection may be used to manage heat.

Figure 2A:
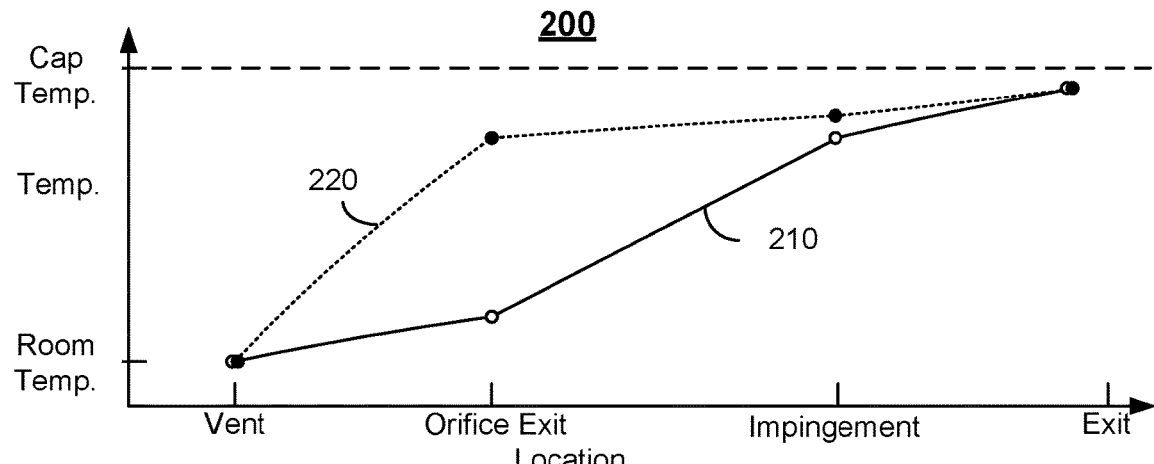
FIGS. 2A-2G depict an indication of fluid temperature in active heat sinks.

For example, FIGS. 2A-2G indicate the change in temperature of fluid driven using cooling system(s) 100 and/or 100'. FIG. 2A is a graph 200 depicting example of performance for cooling system(s) 100 and/or 100'. Graph 200 is for explanatory purposes only and not intended to represent performance of all embodiments of cooling element 120 and/or cooling system(s) 100 and/or 100'. More specifically, graph 200 depicts the temperature of the fluid at various locations in cooling system(s) 100 and/or 100'. Location "Vent" indicates the fluid temperature at the entry vent 112 and/or 113 to cooling system(s) 100 and/or 100', respectively. Location "Orifice Exit" indicates the fluid temperature after exiting orifices 132 for cooling system(s) 100 and/or 100', respectively. Location "Impingement" indicates the fluid temperature after impinging on heat-generating structure 102 for cooling system(s) 100 and/or 100', respectively. Location "Exit" indicates the fluid temperature upon exiting the region shown for cooling system(s) 100 and/or 100', respectively. "Cap Temp." indicates the temperature at which heat-generating structure 102 or integrated circuit 103 is desired to remain below.

Graph 200 includes plot 210 that may be considered to describe high flow behavior, while plot 220 can be considered to describe low flow behavior. Plot 210 (high flow) may be for flows on the order of 0.1 cfm in some embodiments. Plot 220 (low flow) may be for flows on the order of 0.01 cfm. Other flow rates are possible. More generally, plot 210 may occur where the flow of fluid driven by cooling element 120 and/or 120' through cooling systems 100 and/or 100' is sufficient to cool portions of cooling systems 100/100' such that their temperatures are significantly less than that of heat-generating structure 102. Plot 220 may occur where the flow of fluid driven by cooling element 120 and/or 120' through cooling systems 100 and/or 100' is insufficient to cool portions of cooling systems 100/100', such that their temperatures are close to that of heat-generating structure 102. More specifically, plot 210 indicates the behavior for cooling system(s) 100 and/or 100' when the temperature of cooling system 100 and/or 100' (e.g. the temperature of cooling element 120 and support structure 170/170') is well below the temperature of heat-generating structure 102. For example, plot 210 may describe the temperatures when cooling system(s) 100 and/or 100' are at or near room temperature (e.g. twenty-five degrees Celsius) while heat-generating structure 102 and/or integrated circuit 103 are at or near the cap temperature (e.g. ninety degrees Celsius). Plot 220 indicates the behavior for cooling system(s) 100 and/or 100' when the temperature of cooling system 100 and/or 100' (e.g. the temperature of cooling element 120 and support structure 170/170') is at or near the temperature of heat-generating structure 102. For example, plot 220 may describe the temperatures when cooling system(s) 100 and/or 100' are at or near eighty through eighty-eight degrees Celsius while heat-generating structure 102 and/or integrated circuit are at or near the ninety degrees Celsius.

Cooling system(s) 100 and/or 100' are being heated by heat thermally conducted from heat-generating structure 102. For plot 210, fluid entering cooling system(s) 100 and/or 100' at vent 112 and/or 113 is at or near room temperature. The rate of fluid flow is high (e.g. 0.05 cfm-0.1 cfm or more). In some embodiments, the fluid flow is sufficiently high that enough heat is removed from cooling system(s) 100 and/or 100' to ensure that the temperature(s) of portions of cooling system(s) 100 and/or 100' distal from heat-generating structure are low. As the fluid travels through chambers 140/150 and/or 140'/150 due to vibrational motion of cooling element 120, some heat is transferred to the fluid. In some embodiments, sufficient heat is transferred (removed from cooling system(s) 100 and/or 100') to reduce the temperature of sections of cooling systems(s) 100 and/or 100' that are distal from heat-generating structure 102. Fluid continues to remove heat from cooling system(s) 100 and/or 100' as the fluid transits the cooling system. Thus, the fluid increases gradually in temperature as the fluid passes through chambers 140 and 150. The fluid impinging on heat-generating structure 102 transfers a significant amount of heat from heat-generating structure 102 to the fluid. Thus, the temperature of the fluid has increased greatly at the "Impingement" location. Only a small amount of additional heat might be removed as the fluid continues to travel along the surface of heat-generating structure 102 to the exit. Thus, a significant amount of heat is transferred for the plot 210, partly by removing heat from cooling system(s) 100 and; or 100' and partly by the fluid impinging on heat-generating structure 102. For example, in some embodiments, for a heat-generating structure operating at ninety degrees Celsius, room temperature fluid entering vent 112/113 may exit at a temperature of at least seventy degrees Celsius. For a heat-generating structure operating at ninety degrees Celsius, room temperature fluid entering vent 112/113 may exit at a temperature of at least seventy-five to eighty degrees Celsius in some such embodiments.

For plot 220, fluid entering cooling system(s) 100 and/or 100' at vent 112 and/or 113 is at or near room temperature. However, the rate of fluid flow is low. In some embodiments, the fluid flow is sufficiently low that not enough heat is removed from cooling system(s) 100 and/or 100' to ensure that the temperature(s) of portions of cooling system(s) 100 and/or 100' distal from heat-generating structure are low. Heat from heat-generating structure 102 and/or integrated circuit 103 (or other heat source) has been transferred to cooling system 100 via thermal conduction. Heat from cooling system(s) 100 and/or 100' (e.g. cooling element 120 and/or support structure 170/170') is transferred to the fluid as the fluid travels through chambers 140/150 and/or 140'/150 due to vibrational motion of cooling element 120. Thus, the temperature of the fluid has increased greatly at the "Orifice Exit" location. The fluid impinging on heat-generating structure 102 may transfer a small amount of additional heat from heat-generating structure 102 to the fluid. Only a limited amount of additional heat might be removed as the fluid continues to travel to the exit. Thus, for the low flow plot 220, heat is transferred to the fluid primarily by the fluid passing through cooling system(s) 100 and/or 100'. For example, in some embodiments, for a heat-generating structure operating at ninety degrees Celsius, room temperature fluid entering vent 112/113 may exit at a temperature of at least seventy degrees Celsius. For a heat-generating structure operating at ninety degrees Celsius, room temperature fluid entering vent 112/113 may exit at a temperature of at least seventy-five to eighty degrees Celsius in some such embodiments.

As can be seen in plots 210 and 220 for cooling system(s) 100 and/or 100' at low temperature with respect to heat-generating structure 102 (high flow) or for cooling system(s) 100 and/or 100' at or near the temperature of heat-generating structure 102 (low flow), a significant amount of heat may be transferred efficiently to the fluid. In addition, a significant amount of heat generated by integrated circuit 103 is removed by the fluid. Thus, cooling system(s) 100 and/or 100' efficiently remove heat for both low and high flows.

However, higher fluid flows may remove more heat per unit time and result in portions of cooling system(s) 100 and/or 100' being at a lower temperature.

The efficiency of cooling system(s) 100 and/or 100' may also be seen mathematically. The amount of heat per unit time (H) transferred to a fluid (which is then removed s the fluid exits the system) may be given by:

$$H=(dm/dt)C_p \Delta T$$

Where dm/dt is the mass flow for the fluid
$C_p$ is the specific heat of the fluid
$\Delta T$ is the change in temperature of the fluid.

The change in temperature of the fluid can be broken down to:

$$\Delta T = \Delta T_{chamber} + \Delta T_{Impingement} + \Delta T_{jet\ channel}$$

Where $\Delta T_{chamber}$ is the change in fluid temperature through chamber 140/150 or 140'/150

$\Delta T_{Impingement}$ is the change in fluid temperature due to impingement on heat-generating structure 102

$\Delta T_{jet\ channel}$ is the change in fluid temperature as the fluid travels in the jet channel Thus, for the high flow case, most of the temperature change for the fluid occurs for $\Delta T_{Impingement}$. Thus, heat-generating structure 102 may be rapidly cooled. For the low flow case, most of the temperature change for the fluid occurs for $\Delta T_{chamber}$. However, in either case, the fluid driven by cooling element 120 efficiently removes heat generated by integrated circuit 103 and/or heat-generating structure 102. For example, in both cases, fluid entering at room temperature may have a temperature of at least seventy degrees Celsius when exiting the system. In some embodiments (e.g. for lower flows and/or higher heat generated), fluid entering at room temperature may have a temperature of at least seventy-five degrees Celsius when exiting the system. In some embodiments, fluid entering at room temperature may have a temperature of at least eighty degrees Celsius when exiting the system. This is in contrast to conventional systems utilizing conventional mechanisms (e.g. fans) for blowing fluid over a heat spreader in which fluid entering at room temperature may have a temperature not exceeding forty or fifty degrees Celsius. Thus, the large change in fluid temperature (e.g. on the order of forty to fifty-five degrees Celsius or more) in some embodiments of cooling system(s) 100 and/or 100' indicates that a significantly larger amount of heat may be removed using cooling system(s) 100 and/or 100'.

Figure 2B:
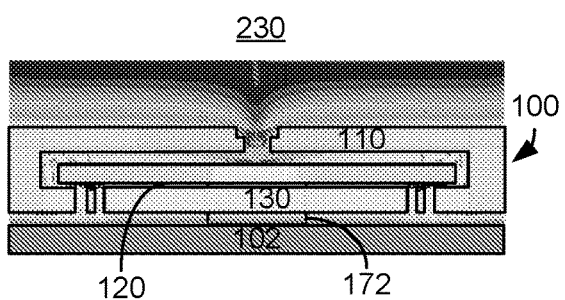
Figure 2D:
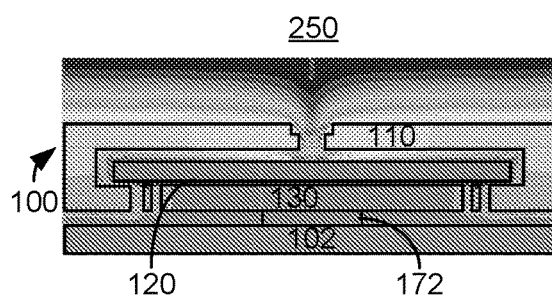
Figure 2C:
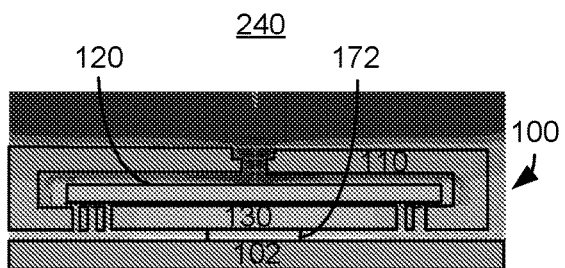

The change in temperature of the fluid may also be seen in FIGS. 2B-2G. FIGS. 2B-2G depict cooling system 100 under various conditions. For simplicity, only top plate 110, cooling element 120, orifice plate 130, pedestal 172, and heat-generating structure 102 are labeled. In FIGS. 2B-2G, heat-generating structure has the highest temperature. FIG. 2B depicts a heat map 230 for an embodiment of a cooling system which is not thermally coupled via conduction to heat-generating structure 102 at low flow (e.g. 0.015 cfm). For example, pedestal 172 connecting orifice plate 130 to heat-generating structure 102 may be thermally insulating. FIG. 2C depicts a heat map 240 for an embodiment of a cooling system which is not thermally coupled via conduction to heat-generating structure 102 at higher flow (e.g. 0.1 cfm). As can be seen in heat map 230 of FIG. 2B, some heat is transferred to cooling system 100, while the fluid well above top plate 110 remains cool. Thus, for low flow, some heat is transferred to cooling system 100, but is not significantly removed by the low fluid flow. Heat map 240 of FIG. 2C indicates that the higher fluid flow more efficiently removes heat from cooling system 100. Thus, cooling system 100 is cooler. Fluid above cooling system 100 is more consistently cool, including closer to cooling system 100.

Figure 2E:
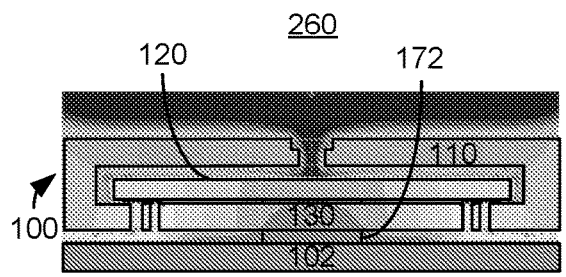

FIG. 2D depicts heat map 250 for an embodiment of cooling system 100 which is thermally coupled via conduction (e.g. through pedestal 172 having a high thermal conductivity) to a heat-generating structure at low flow (e.g. 0.015 cfm). FIG. 2E depicts a heat map 260 for an embodiment of a cooling system which is thermally coupled via conduction (e.g. through pedestal 172 having a high thermal conductivity) to a heat-generating structure at higher flow (e.g. 0.1 cfm). As can be seen in heat map 250 of FIG. 2D, a significant amount of heat is transferred to cooling system 100 via thermal conduction through pedestal 172. Thus, part of orifice plate 130 and cooling element 120 are close in temperature to heat-generating structure 102. Fluid near top plate 110 has been heated somewhat, while the fluid well above top plate 110 remains cool. Thus, for low flow, heat is transferred to cooling system 100 via conduction, but is not significantly removed by the low fluid flow. Heat map 260 of FIG. 2E indicates that the higher fluid flow more efficiently removes heat from cooling system 100. Thus, although heat would be transferred via conduction (as indicated by heat map 250), cooling system 100 has been cooled by fluid flow. Thus, top plate 110, cooling element 120, most of orifice plate 130, and part of pedestal 172 are lower in temperature in heat map 260 than in heat map 250. Consequently, heat is removed from heat-generating structure 102 via conduction (to cooling system 100) and convection (from cooling system 100 to fluid, which exits the region).

As can be seen in FIGS. 2B-2E, when thermally coupled to the heat-generating structure, heat may be transferred to the cooling system 100/cooling element 120 via conduction. A flow through the cooling system 100, driven by vibrational motion of the cooling element, can effectively remove heat from the cooling system and, therefore, from the heat-generating structure.

Figure 2F:
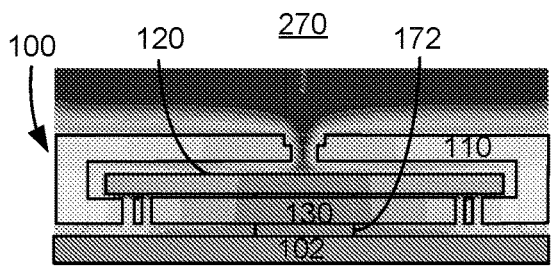
Figure 2G:
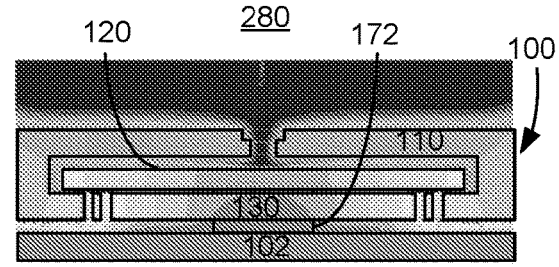

Similarly, FIGS. 2F and 2G depict heat maps 270 and 280, respectively, for an embodiment of a cooling system that is thermally coupled via conduction to a heat-generating structure. FIG. 2F depicts a heat map 270 for an embodiment of a cooling system which is thermally coupled via conduction (e.g. through pedestal 172 having a high thermal conductivity) to a heat-generating structure at lower flow (e.g. 0.05 cfm). FIG. 2G depicts a heat map 260 for an embodiment of a cooling system which is thermally coupled via conduction (e.g. through pedestal 172 having a high thermal conductivity) to a heat-generating structure at higher flow (e.g. 0.1 cfm). As can be seen in FIGS. 2F-2G, when thermally coupled to the heat-generating structure, heat may be transferred to the cooling system via conduction. Thus, pedestal 172 and larger portions of orifice plate 130 and cooling element 120 are shown as having a higher temperature in heat map 270. In addition, heat map 270 indicates that the highest temperature for cooling system 100 occur near pedestal 172, which is thermally connected to heat-generating structure 102. Heat map 280 also indicates that the highest temperature for cooling system 100 occur near pedestal 172, which is thermally connected to heat-generating structure 102. However, portions of top plate 110, cooling element 120, and orifice plate 130 have been cooled by the higher flow. The lowest temperatures of structures 110, 120, and 130 are in proximity to the higher flow. A flow through the cooling system, driven by vibrational motion of the cooling element, can effectively remove heat from the cooling system and, therefore, from the heat-generating structure.

Thus, cooling system 100 and/or 100' may efficiently remove significant amounts of heat generated while having a small size, having low profile and/or being low noise. Thus, performance of a variety of systems employing cooling system(s) 100 and/or 100' may be improved.

FIGS. 3A-3D depict plan views of embodiments of cooling systems 300A, 300B, 300C and 300D analogous to active cooling systems such as cooling system 100. FIGS. 3A-3D are not to scale. For simplicity, only portions of cooling elements 320A, 320B, 320C and 320D and anchors 360A, 360B, 360C and 360D, respectively, are shown. Cooling elements 320A, 320B, 320C and 320D are analogous to cooling element 120. Thus, the sizes and/or materials used for cooling elements 320A, 320B, 320C and/or 320D may be analogous to those for cooling element 120. Anchors 360A, 360B, 360C and 360D are analogous to anchor 160 and are indicated by dashed lines.

Figure 3A:
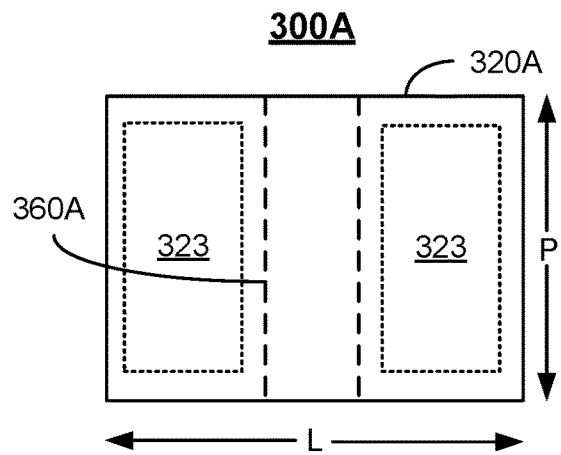
FIGS. 3A-3D depict embodiments of actuators usable in active cooling systems including centrally anchored cooling elements.
Figure 3B:
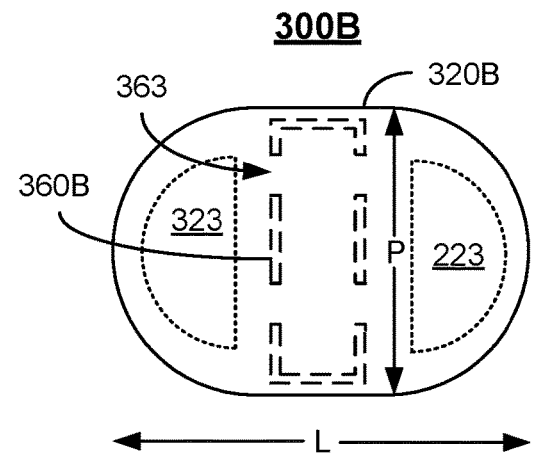

For cooling elements 320A and 320B, anchors 360A and 360B are centrally located and extend along a central axis of cooling elements 320A and 320B, respectively. Thus, the cantilevered portions (i.e. cantilevered arms) that are actuated to vibrate are to the right and left of anchors 360A and 360B. In some embodiments, cooling element(s) 320A and/or 320B are continuous structures, two portions of which are actuated (e.g. the cantilevered portions outside of anchors 360A and 360B). In some embodiments, cooling element(s) 320A and/or 320B include separate cantilevered portions each of which is attached to the anchors 360A and 360B, respectively, and actuated. Cantilevered portions of cooling elements 320A and 320B may thus be configured to vibrate in a manner analogous to the wings of a butterfly (in-phase) or to a seesaw (out-of-phase). In FIGS. 3A and 3B, L is the length of the cooling element, analogous to that depicted in FIGS. 1A-1F. Also in FIGS. 3A and 3B, the depth, P, of cooling elements 320A and 320B is indicated.

Also shown by dotted lines in FIGS. 3A-3B are piezoelectric 323. Piezoelectric 223 is used to actuate cooling elements 320A and 320B. Although described in the context of a piezoelectric, another mechanism for actuating cooling elements 360A and 360B can be utilized. Such other mechanisms may be at the locations of piezoelectric 323 or may be located elsewhere. In cooling element 360A, piezoelectric 323 may be affixed to cantilevered portions or may be integrated into cooling element 320A. Further, although piezoelectric 323 is shown as having particular shapes and sizes in FIGS. 3A and 3B, other configurations may be used.

In the embodiment shown in FIG. 3A, anchor 360A extends the entire depth of cooling element 320A. Thus, a portion of the perimeter of cooling element 360A is pinned. The unpinned portions of the perimeter of cooling element 360A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 3B, anchor 360B does not extend to the perimeter of cooling element 320B. Thus, the perimeter of cooling element 320B is unpinned. However, anchor 360B still extends along the central axis of cooling element 320B. Cooling element 320B is still actuated such that cantilevered portions vibrate (e.g. analogous to the wings of a butterfly).

Although cooling element 320 A is depicted as rectangular, cooling elements may have another shape. In some embodiments, corners of cooling element 320A may be rounded. Cooling element 320B of FIG. 3B has rounded cantilevered sections. Other shapes are possible. In the embodiment shown in FIG. 3B, anchor 360B is hollow and includes apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. Thus, cooling element 320B may be used in place of a top plate, such as top plate 110. In such embodiments, apertures in cooling element 320B and apertures 363 may function in an analogous manner to vent 112. Further, although cooling elements 300A and 300B are depicted as being supported in a central region, in some embodiments, one cantilevered section of the cooling element 320A and/or 320B might be omitted. In such embodiments, cooling element 320A and/or 320B may be considered to be supported, or anchored, at or near one edge, while at least part of at least the opposing edge is free to undergo vibrational motion. In some such embodiments, the cooling element 320A and/or 320B may include a single cantilevered section that undergoes vibrational motion.

Figure 3C:
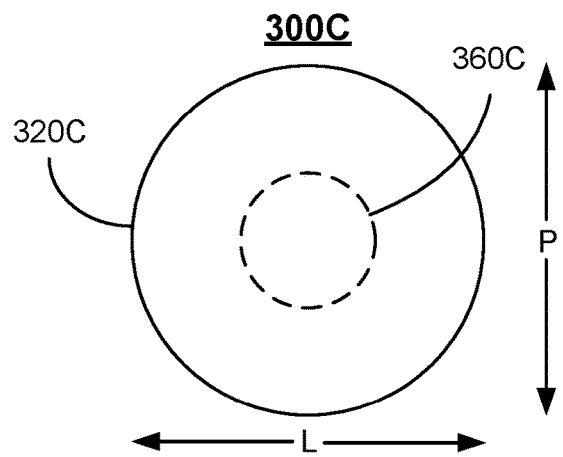
Figure 3D:
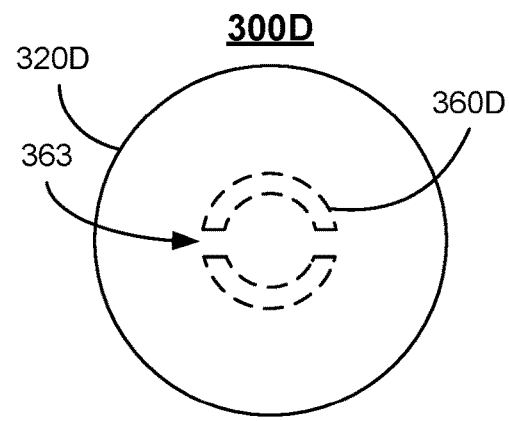

FIGS. 3C-3D depict plan views of embodiments of cooling systems 300C and 300D analogous to active cooling systems such as cooling system 100. For simplicity, only cooling elements 320C and 320D and anchors 360C and 360D, respectively, are shown. Cooling elements 320C and 320D are analogous to cooling element 120. Thus, the sizes and/or materials used for cooling elements 320C and/or 320D may be analogous to those for cooling element 120. Anchors 360A and 360D are analogous to anchor 160 and are indicated by dashed lines.

For cooling elements 320C and 320D, anchors 360C and 360D, respectively, are limited to a central region of cooling elements 320C and 320D, respectively. Thus, the regions surrounding anchors 360C and 360D undergo vibrational motion. Cooling elements 320C and 320D may thus be configured to vibrate in a manner analogous to a jellyfish or similar to the opening/closing of an umbrella. In some embodiments, the entire perimeter of cooling elements 320C and 320D vibrate in phase (e.g. all move up or down together). In other embodiments, portions of the perimeter of cooling elements 320C and 320D vibrate out of phase. In FIGS. 3C and 3D, L is the length (e.g. diameter) of the cooling element, analogous to that depicted in FIGS. 1A-1F. Although cooling elements 320C and 320D are depicted as circular, cooling elements may have another shape. Further, a piezoelectric (not shown in FIGS. 3C-3D) and/or other mechanism may be used to drive the vibrational motion of cooling elements 320C and 320D.

In the embodiment shown in FIG. 3D, the anchor 360D is hollow and has apertures 363. In some embodiments, cooling element 320D has aperture(s) in the region of anchor D. In some embodiments, cooling element 320D includes multiple portions such that aperture(s) exist in the region of anchor 360D. As a result, fluid may be drawn through cooling element 320D and through anchor 360D. The fluid may exit through apertures 363. Thus, cooling element 320D may be used in place of a top plate, such as top plate 110. In such embodiments, apertures in cooling element 320D and apertures 363 may function in an analogous manner to vent 112.

Cooling systems such as cooling system 100 and/or 100' can utilize cooling element(s) 320A, 320B, 320C, 320D and/or analogous cooling elements. Such cooling systems may also share the benefits of cooling system 100100 and/or. Cooling systems using cooling element(s) 320A, 320B, 320C, 320D and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 320A, 320B, 320C, 320D and/or analogous cooling elements may be suitable for use in smaller and/or mobile devices in which limited space is available. Performance of such devices may thus be improved. Because cooling element(s) 320A, 320B, 320C, 320D and/or analogous cooling elements may be vibrated at frequencies of 15 kHz or more, users may not hear any noise associated with actuation of cooling elements. If driven at or near the acoustic and/or structural resonance frequencies for the cooling element(s) 320A, 320B, 320C, 320D and/or analogous cooling elements, the power used in operating cooling systems may be significantly reduced. Cooling element(s) S20A, 320B, 320C, 320D and/or analogous cooling elements may not physically contact the plates during use, allowing resonance to be more readily maintained. The benefits of improved, quiet cooling may be achieved with limited additional power. Consequently, performance of devices incorporating the cooling element(s) 320A, 320B, 320C, 320D and/or analogous cooling elements may be improved.

Figure 4:
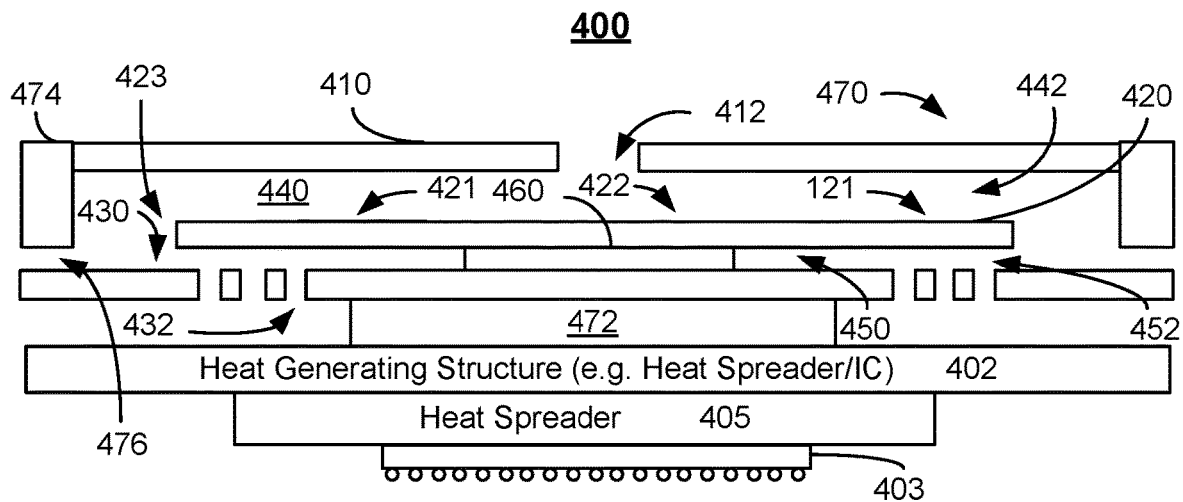
FIG. 4 depicts an embodiment of an active cooling system including an active heat sink.

FIG. 4 depicts an embodiment of active cooling systems 400 usable as an active heat sink. FIG. 4 is not to scale. For simplicity, only portions of cooling system 400 are shown. Cooling system 400 is analogous to cooling systems 100. Consequently, analogous components have similar labels. For example, cooling system 400 is used in conjunction with integrated circuit 503, which is analogous to integrated circuit 103.

Cooling system 400 includes cooling element 420 and support structure 470 analogous to cooling element 120 and support structure 170, respectively. Thus, support structure 470 includes top plate 410 having vent 412, orifice plate 430 including orifices 432, top chamber 440 having a gap, bottom chamber 450 having a gap, anchor 460, and sidewalls 474 that are analogous to top plate 110 having vent 112, cooling element 120, orifice plate 130 including orifices 132, top chamber 140 having gap 142, bottom chamber 150 having gap 152, anchor 160, and sidewalls 174, respectively. Cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 360A and/or 360B). In other embodiments, anchor 460 is only near the center portion of cooling element 420 (e.g. analogous to anchor 360C and/or 360D). Cooling element 420 includes cantilevered arms 421, anchored region 422, and tip 423 that are analogous to cantilevered arms 121, anchored region 122, and tip 123, respectively. In some embodiments, cooling element 420 may be analogous to cooling element 120'. Support structure 470 also includes pedestal 472 analogous to pedestal 172. However, in the embodiment shown, pedestal 572 is integrated into a heat spreader or vapor chamber that is analogous to heat-generating structure 102.

Sidewalls 474 also include apertures 476. In the embodiment shown, sidewalls 474 include apertures 476 and orifice plate 430 includes orifices 432. In some embodiments, orifice plate 430 is free of orifices or vice. Although orifices 476 are shown as oriented parallel to the surface of orifice plate 430, in some embodiments, apertures 476 may have a different orientation. Apertures 476 allow for flow of fluid around cooling element 420, but not past heat-generating structure 402. In cooling system 400, therefore, heat may be transferred from heat-generating structure 402 to pedestal 472, cooling element 420 and other components of cooling system 400.

Also shown in FIG. 4 is an additional heat spreader 405 between heat-generating structure 402 and integrated circuit 403. Thus, cooling system need not be mounted directly to the component 403 that is the source of heat. In other embodiments, heat spreader 405 may be omitted.

Cooling system 400 operates in an analogous manner to cooling system 100. Cooling system 400 thus shares the benefits of cooling system 100. Thus, performance of a device employing cooling system 400 may be improved. Because pedestal 472 has an integrated heat spreader, heat may be more efficiently transferred from integrated circuit 403 to system 400. Heat may then be removed by fluid driven through system 400 by cooling element 420. Thus, performance may be enhanced.

Figure 5:
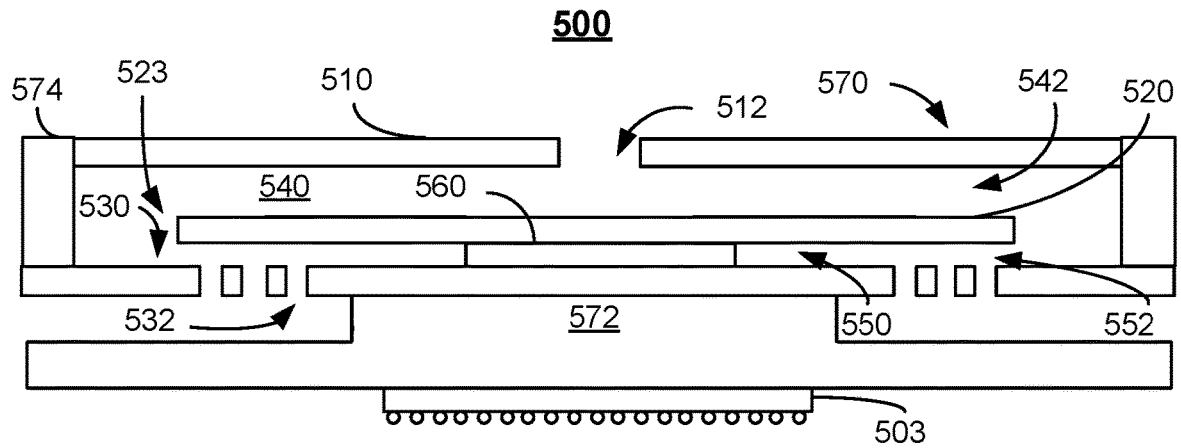
FIG. 5 depicts an embodiment of an active cooling system including an active heat sink.

FIG. 5 depicts an embodiment of active cooling systems 500 usable as an active heat sink. FIG. 5 is not to scale. For simplicity, only portions of cooling system 500 are shown. Cooling system 500 is analogous to cooling systems 100. Consequently, analogous components have similar labels. For example, cooling system 500 is used in conjunction with integrated circuit 503, which is analogous to integrated circuit 103.

Cooling system 500 includes cooling element 520 and support structure 570 analogous to cooling element 120 and support structure 170, respectively. Thus, support structure 570 includes top plate 510 having vent 512, orifice plate 530 including orifices 532, top chamber 540 having a gap, bottom chamber 550 having a gap, anchor 460, and sidewalls 574 that are analogous to top plate 110 having vent 112, cooling element 120, orifice plate 130 including orifices 132, top chamber 140 having gap 142, bottom chamber 150 having gap 152, anchor 160, and sidewalls 174, respectively. Cooling element 520 is centrally supported by anchor 560 such that at least a portion of the perimeter of cooling element 520 is free to vibrate. In some embodiments, anchor 560 extends along the axis of cooling element 520 (e.g. in a manner analogous to anchor 360A and/or 360B). In other embodiments, anchor 560 is only near the center portion of cooling element 520 (e.g. analogous to anchor 360C and/or 360D).

Support structure 570 also includes pedestal 572 analogous to pedestal 172. However, in the embodiment shown, pedestal 572 is integrated into a heat spreader or vapor chamber that is analogous to heat-generating structure 102.

Cooling system 500 operates in an analogous manner to cooling system 100. Cooling system 500 thus shares the benefits of cooling system 100. Thus, performance of a device employing cooling system 500 may be improved. Because pedestal 572 has an integrated heat spreader, heat may be more efficiently transferred from integrated circuit 503 to system 500. Heat may then be removed by fluid driven through system 500 by cooling element 520. Thus, performance may be enhanced.

Figure 6:
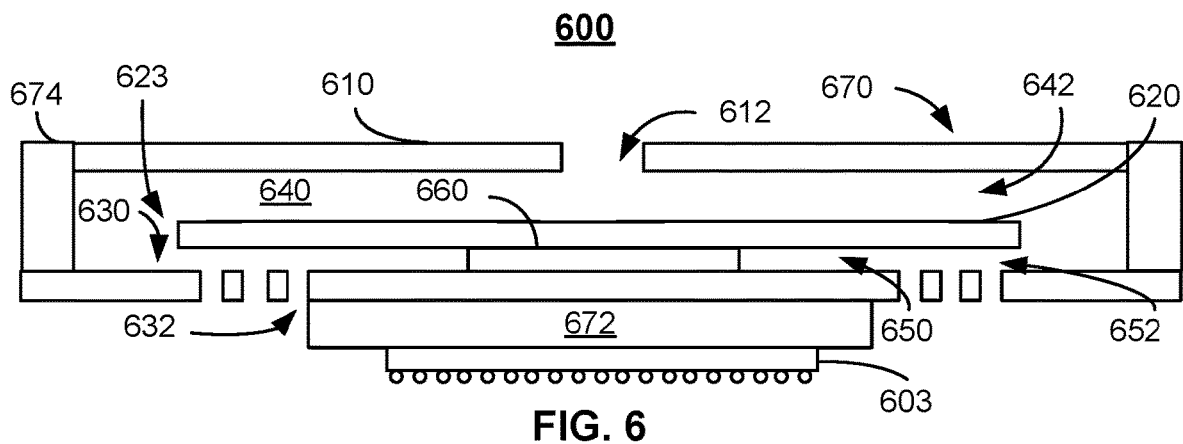
FIG. 6 depicts an embodiment of an active cooling system including an active heat sink.

FIG. 6 depicts an embodiment of active cooling systems 600 usable as an active heat sink. FIG. 6 is not to scale. For simplicity, only portions of cooling system 600 are shown. Cooling system 600 is analogous to cooling systems 100 and/or 500. Consequently, analogous components have similar labels. For example, cooling system 600 is used in conjunction with integrated circuit 603, which is analogous to integrated circuit 103.

Cooling system 600 includes cooling element 620 and support structure 670 analogous to cooling element 120 and support structure 170, respectively. Thus, support structure 670 includes top plate 610 having vent 612, orifice plate 630 including orifices 632, top chamber 640 having a gap, bottom chamber 650 having a gap, anchor 660, and sidewalls 674 that are analogous to top plate 110 having vent 112, cooling element 120, orifice plate 130 including orifices 132, top chamber 140 having gap 142, bottom chamber 150 having gap 152, anchor 160, and sidewalls 174, respectively. Cooling element 620 is centrally supported by anchor 660 such that at least a portion of the perimeter of cooling element 620 is free to vibrate. In some embodiments, anchor 660 extends along the axis of cooling element 620 (e.g. in a manner analogous to anchor 360A and/or 360B). In other embodiments, anchor 660 is only near the center portion of cooling element 620 (e.g. analogous to anchor 360C and/or 360D).

Support structure 670 also includes pedestal 672 analogous to pedestal 172. However, in the embodiment shown, pedestal 672 is thermally coupled via conduction directly to integrated circuit 103.

Cooling system 600 operates in an analogous manner to cooling system 100. Cooling system 600 thus shares the benefits of cooling system 100. Thus, performance of a device employing cooling system 600 may be improved. Because pedestal 672 is directly thermally connected to integrated circuit 603, heat may be more efficiently transferred from integrated circuit 603 to system 600 via conduction. Heat may then be removed by fluid driven through cooling system 600 by cooling element 620. Thus, performance may be enhanced.

Figure 7:
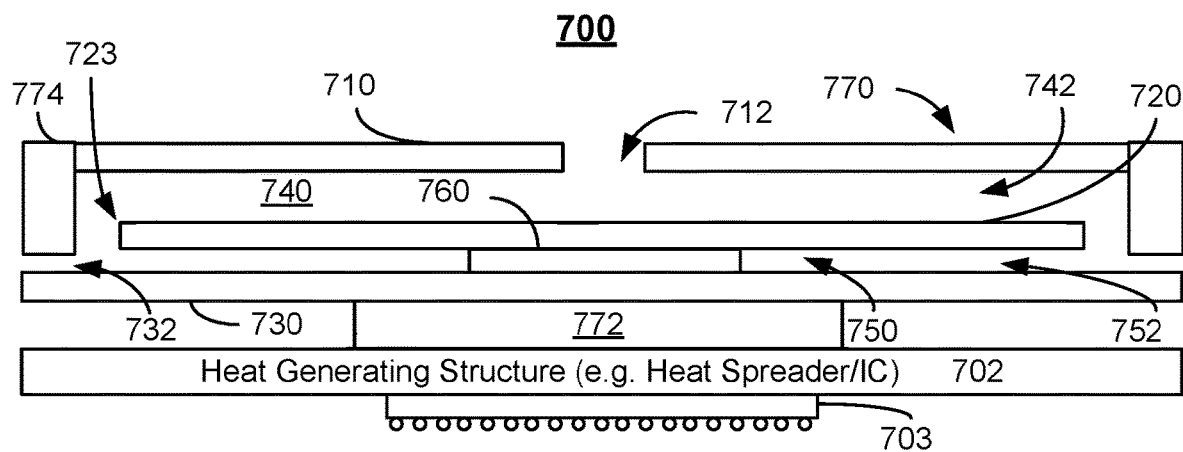
FIG. 7 depicts an embodiment of an active cooling system including an active heat sink.

FIG. 7 depicts an embodiment of active cooling systems 700 usable as an active heat sink. FIG. 7 is not to scale. For simplicity, only portions of cooling system 700 are shown. Cooling system 700 is analogous to cooling systems 100, 500 and/or 600. Consequently, analogous components have similar labels. For example, cooling system 700 is used in conjunction with integrated circuit 703, which is analogous to integrated circuit 103.

Cooling system 700 includes cooling element 720 and support structure 770 analogous to cooling element 120 and support structure 170, respectively. Thus, support structure 770 includes top plate 710 having vent 712, bottom plate 730, top chamber 740 having a gap, bottom chamber 750 having a gap, anchor 760, pedestal 772, and sidewalls 774 that are analogous to top plate 110 having vent 112, cooling element 120, orifice plate 130, top chamber 140 having gap 142, bottom chamber 150 having gap 152, anchor 160, pedestal 172, and sidewalls 174, respectively. Cooling element 720 is centrally supported by anchor 760 such that at least a portion of the perimeter of cooling element 720 is free to vibrate. In some embodiments, anchor 760 extends along the axis of cooling element 720 (e.g. in a manner analogous to anchor 360A and/or 360B). In other embodiments, anchor 760 is only near the center portion of cooling element 720 (e.g. analogous to anchor 360C and/or 360D).

Bottom plate 730 is analogous to orifice plate 130, but has no orifices therein. Instead, orifices 732 in sidewalls 774 are shown. Thus, fluid is ejected in another direction than toward heat generating structure 702. Therefore, cooling system 700 may not cool heat-generating structure 702 via impingement. However, cooling system 700 may still cool heat-generating structure 702 and component 703. Thus, heat from heat-generating structure 702 is transferred to cooling system 700 via conduction through pedestal 722 and removed by the fluid in cooling system 700 driven by vibrational motion of cooling element 720.

Cooling system 700 operates in an analogous manner to cooling system 100. Cooling system 700 thus shares the benefits of cooling system 100. Thus, performance of a device employing cooling system 700 may be improved. For example, heat may be efficiently transferred at steady-state behavior. Thus, performance may be enhanced.

Figure 8:
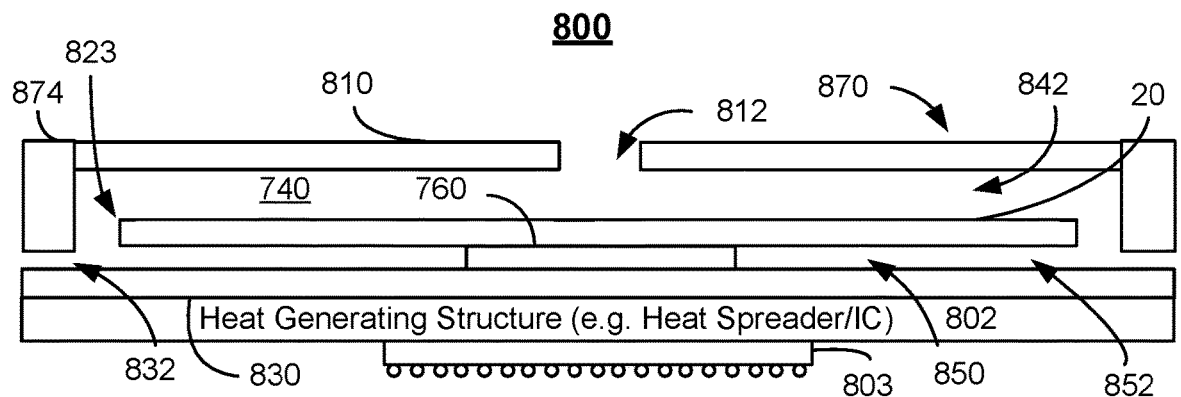
FIG. 8 depicts an embodiment of an active cooling system including an active heat sink.

FIG. 8 depicts an embodiment of active cooling systems 800 usable as an active heat sink. FIG. 8 is not to scale. For simplicity, only portions of cooling system 800 are shown. Cooling system 800 is analogous to cooling systems 100, 500, 600 and/or 700. Consequently, analogous components have similar labels. For example, cooling system 800 is used in conjunction with integrated circuit 803, which is analogous to integrated circuit 803.

Cooling system 800 includes cooling element 820 and support structure 870 analogous to cooling element 120 and support structure 170, respectively. Thus, support structure 870 includes top plate 810 having vent 812, bottom plate 830, top chamber 840 having a gap, bottom chamber 850 having a gap, anchor 860, and sidewalls 874 that are analogous to top plate 110 having vent 112, cooling element 120, orifice plate 130, top chamber 140 having gap 142, bottom chamber 150 having gap 152, anchor 160, and sidewalls 174, respectively. Cooling element 820 is centrally supported by anchor 860 such that at least a portion of the perimeter of cooling element 820 is free to vibrate. In some embodiments, anchor 860 extends along the axis of cooling element 820 (e.g. in a manner analogous to anchor 360A and/or 360B). In other embodiments, anchor 860 is only near the center portion of cooling element 820 (e.g. analogous to anchor 360C and/or 360D).

Cooling system 800 is most analogous to cooling system 700. Thus, bottom plate 830 is analogous to orifice plate 130, but has no orifices therein. Instead, orifices 832 in sidewalls 874 are shown. Thus, fluid is ejected in another direction than toward heat generating structure 802. Therefore, cooling system 800 may not cool heat-generating structure 802 via impingement. Further, the pedestal has been removed. Thus, bottom plate 830 is directly connected to heat-generating structure 802. In some embodiments, heat-generating structure might be removed, allowing bottom plate 830 to be directly coupled to integrated circuit. Thus, heat from heat-generating structure 802 is transferred to cooling system 800 via conduction through bottom plate 830 and removed by the fluid in cooling system 800 driven by vibrational motion of cooling element 820.

Figure 9:
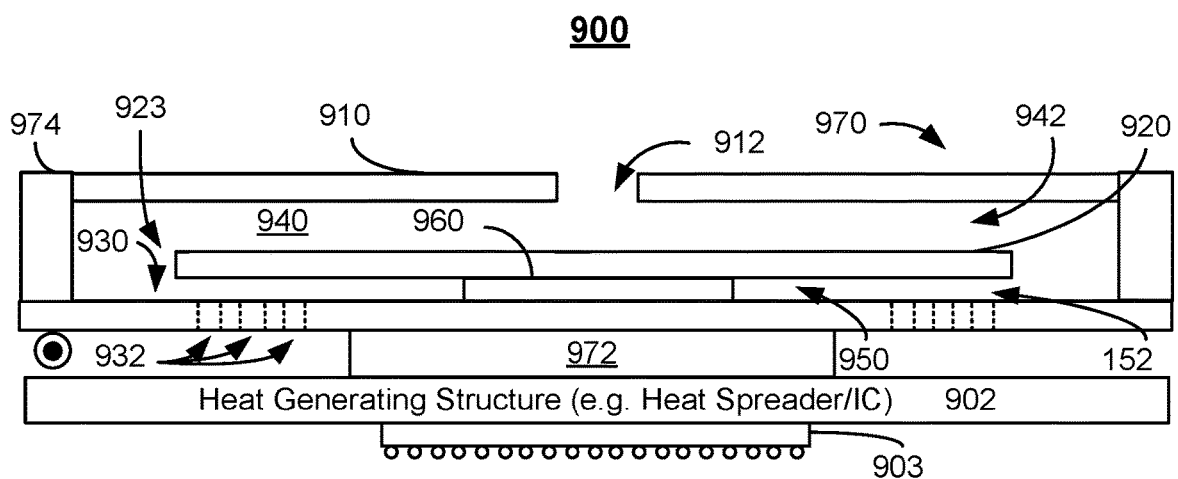
FIG. 9 depicts an embodiment of an active cooling system including an active heat sink.

FIG. 9 depicts an embodiment of active cooling systems 900 usable as an active heat sink. FIG. 9 is not to scale. For simplicity, only portions of cooling system 900 are shown. Cooling system 900 is analogous to cooling systems 100, 500, 600, 700 and/or 800. Consequently, analogous components have similar labels. For example, cooling system 900 is used in conjunction with integrated circuit 803, which is analogous to integrated circuit 903.

Cooling system 900 includes cooling element 920 and support structure 970 analogous to cooling element 120 and support structure 170, respectively. Thus, support structure 970 includes top plate 910 having vent 912, orifice plate 930 having orifices 932 therein, top chamber 940 having a gap, bottom chamber 950 having a gap, anchor 960, pedestal 972, and sidewalls 974 that are analogous to top plate 110 having vent 112, cooling element 120, orifice plate 130 having orifices 132, top chamber 140 having gap 142, bottom chamber 150 having gap 152, anchor 160, pedestal 172 and sidewalls 174, respectively. Cooling element 920 is centrally supported by anchor 960 such that at least a portion of the perimeter of cooling element 920 is free to vibrate. In some embodiments, anchor 960 extends along the axis of cooling element 920 (e.g. in a manner analogous to anchor 360A and/or 360B). In other embodiments, anchor 960 is only near the center portion of cooling element 920 (e.g. analogous to anchor 360C and/or 360D).

Orifice plate 930 does include orifices 932 (shown as dotted lines in FIG. 9). However, orifices 932 do not direct fluid to impinge on heat-generating structure 902. Thus, fluid is ejected in another direction than toward heat generating structure 902. In the embodiment shown, fluid may be driven out of bottom chamber 950 in a direction substantially perpendicular to the plane of the page. Therefore, cooling system 900 may not cool heat-generating structure 902 via impingement. However, cooling system 900 may still cool heat-generating structure 902 and component 903.

Various cooling systems 100, 100', 400, 500, 600, 700, 800, and/or 900 have been described and particular features highlighted. Various characteristics of cooling systems 100, 100', 400, 500, 600, 700, 800, and/or 900 can be combined in manners not explicitly depicted herein.

Figure 10A:
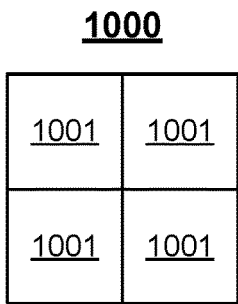
FIGS. 10A-10B depict an embodiment of an active cooling system including multiple cooling cells configured as a tile and including active heat sinks.
Figure 10B:
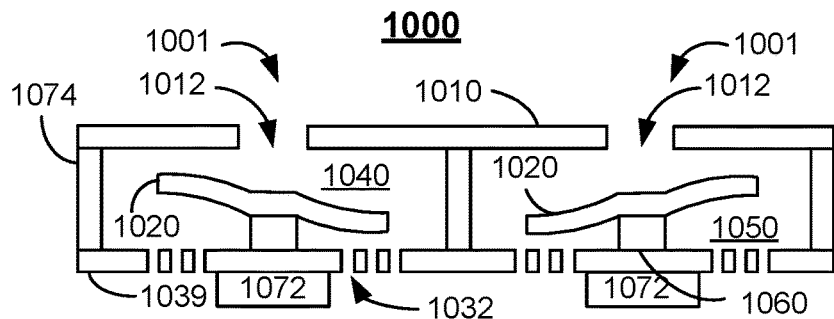

FIGS. 10A-10B depict an embodiment of active cooling system 1000 including multiple cooling cells configured as a tile. FIG. 10A depicts a top view, while FIG. 10B depicts a side view. FIGS. 10A-10B are not to scale. Cooling system 1000 includes four cooling cells 1001, which are analogous to one or more of cooling systems described herein, such as cooling systems 100 and/or 400. Although four cooling cells 1001 in a 2×2 configuration are shown, in some embodiments another number and/or another configuration of cooling cells 1001 might be employed. In the embodiment shown, cooling cells 1001 include shared top plate 1010 having apertures 1012, cooling elements 1020, shared orifice plate 1030 including orifices 1032, top chambers 1040, bottom chambers 1050, pedestals 1072, sidewalls 1074, and anchors 1060 that are analogous to top plate 110 having apertures 112, cooling element 120, orifice plate 130 having orifices 132, top chamber 140, bottom chamber 150, pedestal 172, sidewalls 174 and anchor 160. Although bottom anchors 1060 are shown, in other embodiments top anchors may be used. In the embodiment shown, cooling elements 1020 are driven out-of-phase (i.e. in a manner analogous to a seesaw). Further, cooling element 1020 in one cell is driven out-of-phase with cooling element(s) in adjacent cell(s).

Cooling cells 1001 of cooling system 1000 function in an analogous manner to cooling system(s) 100 and/or 400. Consequently, the benefits described herein may be shared by cooling system 1000. Because cooling elements in nearby cells are driven out-of-phase, vibrations in cooling system 1000 may be reduced. Because multiple cooling cells 1001 are used, cooling system 1000 may enjoy enhanced cooling capabilities.

Figure 11:
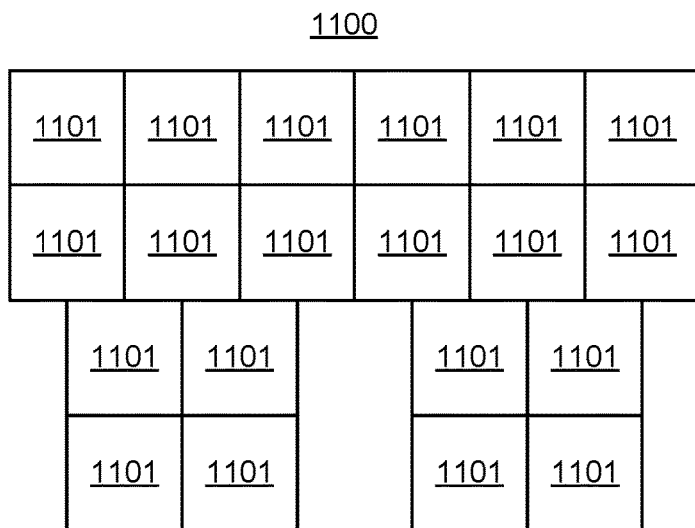
FIG. 11 depicts an embodiment of an active cooling system including multiple cooling cells having active heat sinks.

FIG. 11 depicts a top view of an embodiment of cooling system 1600 including multiple cooling cells 1101. FIG. 11 is not to scale. Cooling cells 1101 are analogous one or more of the cooling systems described herein, such as cooling systems 100 and/or 100'. As indicated in cooling system 1100, cooling cells 1101 may be arranged in a two-dimensional array of the desired size and configuration. In some embodiments, cooling system 1100 may be viewed as made up of multiple tiles 160. Thus, the desired cooling power and configuration may be achieved.

Figure 12:
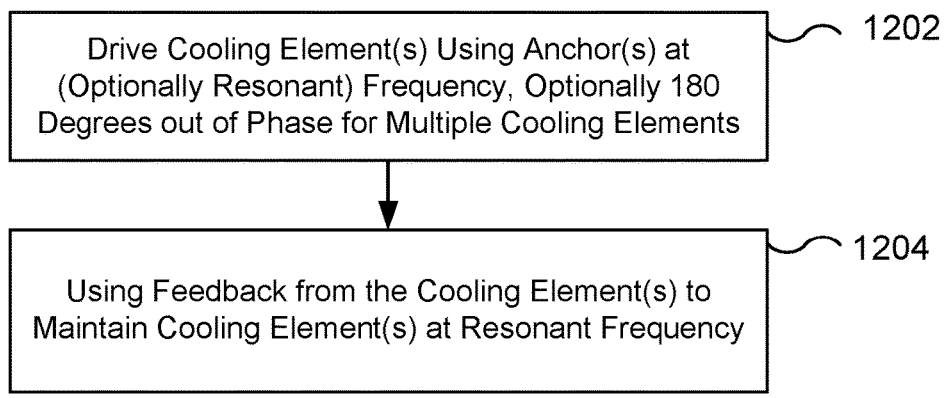
FIG. 12 is a flow chart depicting an embodiment of a technique for driving an active heat sink.

FIG. 12 is a flow chart depicting an exemplary embodiment of method 1200 for operating a cooling system. Method 1200 may include steps that are not depicted for simplicity. Method 1200 is described in the context of piezoelectric cooling system 100. However, method 1200 may be used with other cooling systems including but not limited to systems and cells described herein.

One or more of the cooling element(s) in a cooling system is actuated to vibrate, at 1202. At 1202, an electrical signal having the desired frequency is used to drive the cooling element(s). In some embodiments, the cooling elements are driven at or near structural and/or acoustic resonant frequencies at 1202. The driving frequency may be 15 kHz or higher. If multiple cooling elements are driven at 1202, the cooling elements may be driven out-of-phase. In some embodiments, the cooling elements are driven substantially at one hundred and eighty degrees out of phase. Further, in some embodiments, individual cooling elements are driven out-of-phase. For example, different portions of a cooling element may be driven to vibrate in opposite directions (i.e. analogous to a seesaw). In some embodiments, individual cooling elements may be driven in-phase (i.e. analogous to a butterfly). In addition, the drive signal may be provided to the anchor(s), the cooling element(s), or both the anchor(s) and the cooling element(s). Further, the anchor may be driven to bend and/or translate.

Feedback from the piezoelectric cooling element(s) is used to adjust the driving current, at 1204. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1204 allow the drift in resonant frequency to be accounted for.

For example, piezoelectric cooling element 120 may be driven at its structural resonant frequency/frequencies, at 1202. This resonant frequency may also be at or near the acoustic resonant frequency for top chamber 140. This may be achieved by driving piezoelectric layer(s) in anchor 160 (not shown in FIGS. 1A-1F) and/or piezoelectric layer(s) in cooling element 120. At 1204, feedback is used to maintain cooling element 120 at resonance and, in some embodiments in which multiple cooling elements are driven, one hundred and eighty degrees out of phase. Thus, the efficiency of cooling element 120 in driving fluid flow through cooling system 100 and onto heat-generating structure 102 may be maintained. In some embodiments, 1204 includes sampling the current through cooling element 120 and/or the current through anchor 160 and adjusting the current to maintain resonance and low input power.

Consequently, cooling systems, such as cooling system(s) 100, 100', 400, 500, 600, 700, 800, and/or 900 may operate as described above. Method 1200 thus provides for use of piezoelectric cooling systems described herein. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a cooling element having a first side and a second side opposite to the first side, the cooling element being configured to undergo vibrational motion when actuated to drive a fluid from the first side to the second side; and a support structure thermally coupling the cooling element to a heat-generating structure via thermal conduction, wherein the support structure further includes: a bottom plate; and a plurality of sidewalls forming a chamber therein, the cooling element residing in the chamber, at least one of the bottom plate and the plurality of sidewalls having a plurality of orifices therein, the cooling element being actuated to drive the fluid through the plurality of orifices.

2. The system of claim 1, wherein the vibrational motion drives the fluid such that the fluid exiting the plurality of orifices has a speed of at least thirty meters per second.

3. The system of claim 1, wherein the support structure further includes:
a top plate having at least one vent therein, the cooling element being between the top plate and the heat-generating structure, forming a top chamber between the cooling element and the top plate and a bottom chamber between the cooling element and the bottom plate.

4. The system of claim 1, wherein the cooling element has a central region and a perimeter, and wherein the support structure further includes:
an anchor configured to support the cooling element at the central region, at least a portion of the perimeter being free to undergo the vibrational motion.

5. The system of claim 1, further comprising:
a heat spreader integrated with the support structure, the heat spreader being thermally coupled to the support structure and the heat-generating structure via thermal conduction.

6. The system of claim 5, wherein the support structure is configured such that the fluid exiting at least a portion of the plurality of orifices impinges on the heat spreader to extract heat from the heat spreader, the heat spreader extracting the heat from the heat-generating structure via thermal conduction.

7. The system of claim 1, wherein the cooling element is configured such that the fluid driven by the vibrational motion extracts heat from the cooling element.

8. The system of claim 1, wherein the support structure further includes:
a pedestal thermally conductively coupled to the heat-generating structure.

9. The system of claim 1, wherein the heat-generating structure is selected from an integrated circuit, a battery, a heat spreader, and a vapor chamber.

10. An active heat sink, comprising:
a plurality of cooling cells, each of the plurality of cooling cells including a cooling element, a top plate having at least one vent therein, a bottom plate, a plurality of sidewalls forming a chamber therein, and an anchor, the cooling element residing in the chamber between the top plate and the bottom plate, at least one of the bottom plate and the plurality of sidewalls having a plurality of orifices therein, the cooling element being actuated to undergo vibrational motion to drive a fluid through the plurality of orifices; and a support structure integrated with the plurality of cooling cells and thermally coupling the cooling element to a heat-generating structure via thermal conduction.

11. The active heat sink of claim 10, wherein the cooling element has a central region and a perimeter, and wherein the support structure further includes:
an anchor for each of the plurality of cooling elements, the anchor being configured to support the cooling element at the central region, at least a portion of the perimeter being free to undergo the vibrational motion.

12. The active heat sink of claim 10, further comprising:
a heat spreader integrated with the support structure, the heat spreader being thermally coupled to the support structure and the heat-generating structure via thermal conduction.

13. The active heat sink of claim 10, wherein the cooling element is configured such that the fluid driven by the vibrational motion extracts heat from the cooling element.

14. The active heat sink of claim 10, wherein the support structure further includes:
a pedestal connected and thermally conductively coupled cooling element to the heat-generating structure.

15. The active heat sink of claim 10, wherein the heat-generating structure is selected from an integrated circuit, a battery, a heat spreader, and a vapor chamber.

16. A method of cooling a heat-generating structure, comprising:
driving a cooling element to induce a vibrational motion at a frequency, the cooling element having a first side and a second side opposite to the first side, the cooling element being configured to undergo vibrational motion when actuated to drive a fluid from the first side to the second side, the cooling element being thermally coupled by a support structure to the heat-generating structure, the support structure thermally coupling the cooling element to the heat-generating structure via thermal conduction, wherein the support structure further includes: a bottom plate; and a plurality of sidewalls forming a chamber therein, the cooling element residing in the chamber, at least one of the bottom plate and the plurality of sidewalls having a plurality of orifices therein, the cooling element being actuated to drive the fluid through the plurality of orifices.

17. The method of claim 16, wherein the frequency corresponds to a structural resonance for the cooling element and wherein the frequency also corresponds to an acoustic resonance for at least a portion of a chamber in which the cooling element resides.

18. The method of claim 16, wherein the cooling element is one of a plurality of cooling elements and wherein the driving further includes:
driving the plurality of cooling elements to induce the vibrational motion in each of the plurality of cooling elements, each of the plurality of cooling elements being thermally coupled to the heat-generating structure via thermal conduction.

19. The method of claim 16, wherein a heat spreader is integrated with the support structure, the heat spreader being thermally coupled to the heat-generating structure.

* * * * *